United States Patent [19]

Mikoshiba et al.

[11] Patent Number: 5,316,972
[45] Date of Patent: May 31, 1994

[54] PROCESS FOR FORMING DEPOSITED FILM BY USE OF ALKYL ALUMINUM HYDRIDE AND PROCESS FOR PREPARING SEMICONDUCTOR DEVICE

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 899,940

[22] Filed: Jun. 17, 1992

Related U.S. Application Data

[63] Continuation of Ser. No. 588,548, Sep. 26, 1990, abandoned.

[30] Foreign Application Priority Data

| Sep. 26, 1989 | [JP] | Japan | 1-250022 |
| Sep. 26, 1989 | [JP] | Japan | 1-250023 |
| Jan. 16, 1990 | [JP] | Japan | 2-006559 |
| Jan. 16, 1990 | [JP] | Japan | 2-006560 |

[51] Int. Cl.$^5$ .................................. H01L 21/285
[52] U.S. Cl. .................................. 437/187; 437/194; 437/195; 437/245
[58] Field of Search .................................. 437/245

[56] References Cited

U.S. PATENT DOCUMENTS

| 4,497,683 | 2/1985 | Celler et al. | 437/89 |
| 4,786,615 | 11/1988 | Liau et al. | 437/89 |
| 4,804,560 | 2/1989 | Shioya et al. | 437/192 |
| 4,824,802 | 4/1989 | Brown et al. | 437/192 |
| 4,898,841 | 2/1990 | Ho | 437/192 |
| 4,902,645 | 2/1990 | Ohba | 437/195 |
| 4,920,403 | 4/1990 | Chow et al. | 437/192 |
| 4,960,732 | 10/1990 | Dixit et al. | 437/195 |
| 4,963,511 | 10/1990 | Smith | 437/192 |
| 5,006,484 | 4/1991 | Harada | 437/195 |
| 5,208,187 | 5/1993 | Tsubouchi et al. | 437/194 |

FOREIGN PATENT DOCUMENTS

| 0011227 | 1/1987 | Japan | 437/203 |
| 63-33569 | 2/1988 | Japan | . |
| 0066932 | 3/1988 | Japan | 437/203 |
| 1252776 | 10/1989 | Japan | . |
| 0276624 | 11/1989 | Japan | 437/89 |
| 2012913 | 1/1990 | Japan | 437/195 |
| 0058217 | 2/1990 | Japan | 437/203 |
| 0185026 | 7/1990 | Japan | . |
| 2170419 | 7/1990 | Japan | . |
| 2185026 | 7/1990 | Japan | . |

OTHER PUBLICATIONS

R. A. Levy et al., "Characterization of LPCVD Aluminum for VLSI Processing", Journal of the Electrochemical Society, vol. 131, No. 9, pp. 2175–2182, Sep. 1984.
R. Bhat et al., "The Growth and Characterization of AlGaAs Using Dimethyl Aluminum Hydride", Journal of Crystal Growth, vol. 77, pp. 7–10 (1986).
M. Hanabusa et al., "Photochemical Vapor Deposition of Aluminum Thin Films Using Dimethylaluminum Hydride", Japanese Journal of Applied Physics, vol. 27, No. 8, pp. L1392–L1394, Aug. 1988.
A. Sekiguchi et al., "Gas–Temperature–Controlled (GTC) CVD of Aluminum and Aluminum–Silicon Alloy Film for VLSI Processing", Japanese Journal of Applied Physics, vol. 27, No. 11, pp. L2134–L2136, Nov. 1988.
Pierson, Thin Solid Films, vol. 45, pp. 257–263 (1977).
Hanabusha, et al., Japanese Journal of Applied Physics, vol. 27, No. 8 pp. 1392–1394 (Aug., 1988).

Primary Examiner—Olik Chaudhuri
Assistant Examiner—Ourmazd S. Ojan
Attorney, Agent, or Firm—Fitzpatrick, Cella, Harper & Scinto

[57] ABSTRACT

In forming a deposited film composed mainly of Al according to the CVD method utilizing gas of alkyl aluminum hydride, hydrogen gas, and if desired, further gas containing Si atoms, film formation is carried out by shifting the deposition rate from a low deposition rate to a high deposition rate.

According to this method, excellent selectivity is exhibited and also a film excellent in flatness can be deposited at a high deposition rate.

43 Claims, 12 Drawing Sheets

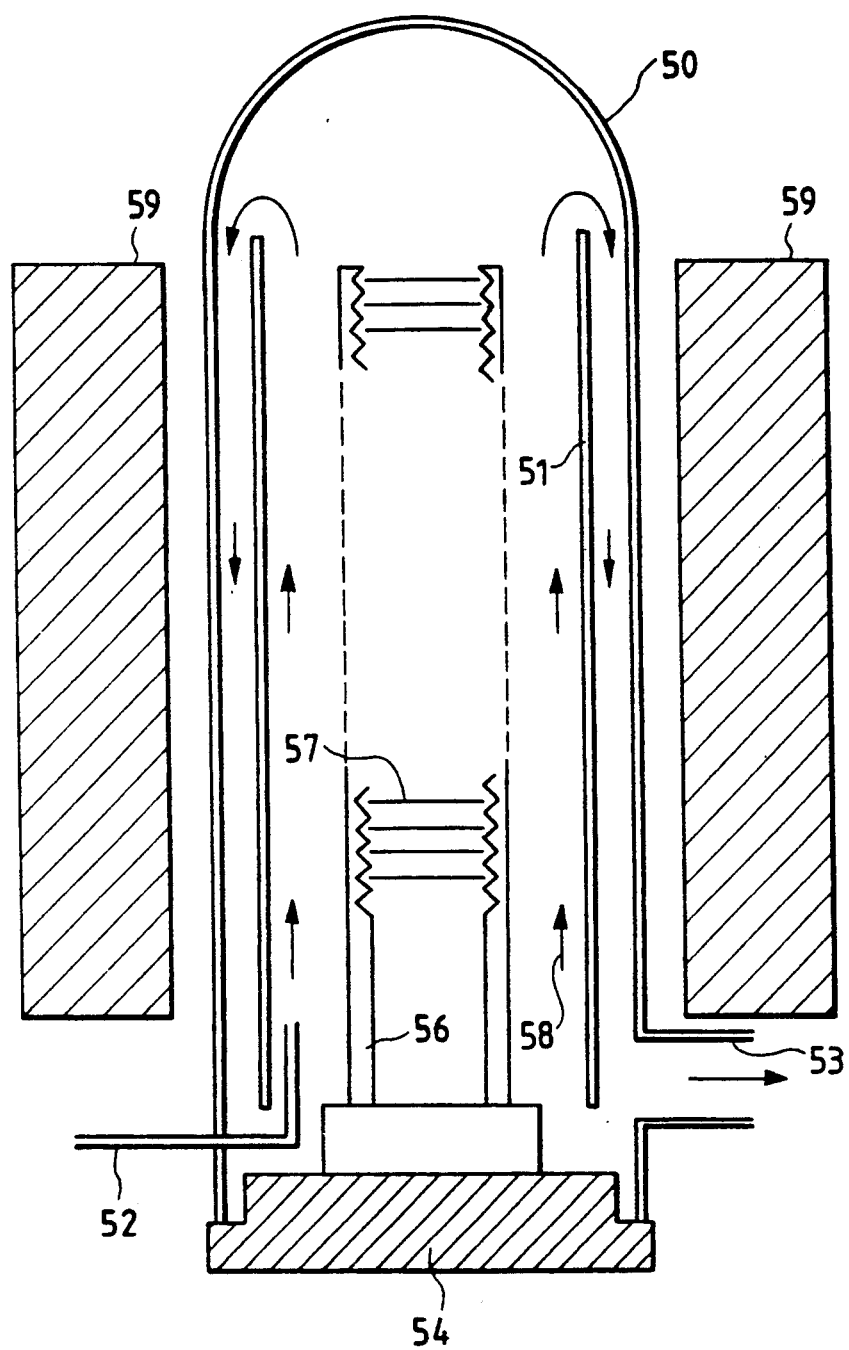

× — DIRECT BEAM SPOT POSITION

× — DIRECT BEAM SPOT POSITION

PROCESS FOR FORMING DEPOSITED FILM BY USE OF ALKYL ALUMINUM HYDRIDE AND PROCESS FOR PREPARING SEMICONDUCTOR DEVICE

This application is a continuation of application Ser. No. 07/588,548 filed Sep. 26, 1990, which is now abandoned.

BACKGROUND OF THE INVENTION

1. Field of the Invention

This invention relates to a process for forming a deposited film, particularly a process for forming a deposited film composed mainly of Al which can be preferably applied to electrodes or wiring of a semiconductor integrated circuit device, etc. and to a process for preparing a semiconductor device.

2. Related Background Art

In the prior art, in electronic devices or integrated circuits by use of semiconductors, for electrodes and wiring, aluminum (Al) or a metal containing aluminum as main component such as Al—Si and the like has been primarily used. Al has many advantages such as that it is inexpensive and high in electroconductivity, that it can be also internally chemically protected because a dense oxidized film can be formed on the surface, and that it has good adhesion to Si, etc.

As the method for forming a film for electrodes and wiring of Al or Al—Si as mentioned above, there has been used in the prior art the sputtering method such as magnetron sputtering, etc.

However, selective deposition and selective growth can not be realized by the sputtering method which has been used in the prior art. The sputtering is the physical deposition method based on flying of sputtered particles in a vacuum. The thickness at the stepped portion or the insulating film side wall becomes extremely thin, leading to wire breaking in an extreme case. Nonuniformity of film thickness or wire breaking has the drawback that reliability of LSI is markedly lowered.

On the other hand, since the integration degree of the integrated circuit such as LSI, etc. is increased, and fine formation of wiring or multi-layer wiring has been particularly required in recent years, there is an increasing great demand not found up to date for Al or Al—Si wiring of the prior art. With finer dimensional formation by increased integration degree, the surface of LSI, etc. is subject to excessive unevenness due to oxidation, diffusion, thin film deposition, and etching, etc. For example, electrodes or wiring metal must be deposited on the surface with a stepped difference, or deposited in a via-hole which is fine in diameter and deep. In 4 Mbit or 16 Mbit DRAM (dynamic RAM), etc., the aspect ratio (via-hole depth/via-hole diameter) of via-hole in which a metal composed mainly of Al such as Al—Si, etc. is to be deposited, is 1.0 or more, and the viahole diameter itself also becomes 1 Mm or less. Therefore, even for a via-hole with large aspect ratio, the technique which can deposit an Al—Si compound is required.

Particularly, for performing sure electrical connection to the device under insulating film such as $SiO_2$, etc., rather than film formation, Al—Si is required to be deposited so as to embed only the viahole of the device. In such case, a method of depositing an Al alloy only on Si or metal surface and not depositing it on an insulating film such as $SiO_2$, etc. is required.

As the improved sputtering method, there has been developed the bias sputtering method in which a bias voltage is applied on a substrate and deposition is performed so as to embed Al or an Al—Si compound only in the via-hole by utilizing the sputter etching action and the deposition action on the substrate surface. However, since the bias voltage of some 100 V or higher is applied on the substrate, deleterious influence on the device occurs because of charged particles damages such as change in threshold of MOSFET, etc. Also, because of presence of both etching action and deposition action, there is the problem that the deposition speed cannot be essentially improved.

In order to solve the problems as described above, various types of CVD (Chemical Vapor Deposition) methods have been proposed. In these methods, chemical reaction of the starting gas in some form is utilized. In plasma CVD or optical CVD, decomposition of the starting gas occurs in gas phase, and the active species formed there further react on the substrate to give rise to film formation. In these CVD methods, surface coverage on unevenness on the substrate surface is good. However, carbon atoms contained in the starting gas molecule are incorporated into the film. Also, particularly in plasma CVD, the problem remained that there was damage by charged particles (so called plasma damage) as in the case of the sputtering method.

The thermal CVD method, in which the film grows through the surface reaction primarily on the substrate surface, is good in surface coverage on unevenness such as stepped portion of the surface, etc. Also, it can be expected that deposition within via-hole will readily occur. Further, wire breaking at the stepped portion can be avoided. Furthermore, there are no damages caused by charged particles which have been observed in the case of the plasma CVD or the sputtering method. The methods of such a kind include, for example, the method seen in Journal of Electrochemical Society, Vol. 131, p. 2175 (1984). In this method triisobutyl aluminum (i-$C_4H_9$)$_3$Al (TIBA) is used as organic aluminum gas and an Al film is formed at a film formation temperature of 260° C. and a reaction tube pressure of 0.5 Torr. The substrate temperature is then maintained at about 450° C. and $SiH_4$ is introduced to diffuse Si in the Al film, thus obtaining an Al—Si film.

When TIBA is to be used, a continuous film can not be obtained unless pretreatment is effected in which prior to film formation, $TiCl_4$ is flowed to activate the substrate surface to form nuclei. Furthermore, in case where TIBA is used, there is a problem that surface flatness is not sufficient even when $TiCl_4$ is used. By this method it is not possible to effect selective growth such as Al—Si deposition only in via-holes.

As another method, there is the method described in Japanese Journal of Applied Physics, Vol. 27, No. 11, p. L2134 (1988). In this method, TIBA and $Si_2H_6$ diluted with Ar gas are supplied, and the gases are heated before TIBA reaches the substrate. By this method, an Al—Si film of a low resistivity can be epitaxially grown on a Si (100) wafer. Although the film obtained by this method has good high quality, there are problems involving difficulty in process control due to the necessity of heating the gases and a complicated apparatus for effecting this method.

Japanese Laid-Open Patent Application No. 63-33569 describes a method of forming a film by using no $TiCl_4$, but using in place thereof organic aluminum and heating it in the vicinity of the substrate.

According to this method, Al can be deposited selectively only on the metal or semiconductor surface from which the naturally oxidized film has been removed.

In this case, it is clearly stated that the step of removing the naturally oxidized film on the substrate surface is necessary before introduction of TIBA. Also, it is described that, since TIBA can be used alone, no carrier gas is required, but Ar gas may be also used as the carrier gas. However, the reaction of TIBA with another gas (e.g. $H_2$) is not contemplated at all, and there is no description of using $H_2$ as the carrier gas. Also, in addition to TIBA, trimethyl aluminum (TMA) and triethyl aluminum (TEA) are mentioned, but there is no specific description of other organic metals. This is because, since the chemical properties of organic metals generally vary greatly if the organic substituent attached to the metal element varies little, it is necessary to investigate individually by detailed experimentation to determine what organic metal should be used.

In the CVD method as described above, not only is there is the inconvenience that the naturally oxidized film must be removed, but also there is the drawback that no surface smoothness can be obtained. Also, there is the restriction that heating of the gas is necessary, and yet heating must be done in the vicinity of the substrate. Moreover, it must also be experimentally determined at what proximity to the substrate heating must be done, whereby there is also the problem that the place for setting the heater cannot be necessarily freely chosen.

In the pre-text of the 2nd Symposium of Electrochemical Society, Branch of Japan (Jul. 7, 1989), on page 75, there is a description of film formation of Al according to the double wall CVD method. In this method, TIBA is used and the device is designed so that the gas temperature of TBA can be made higher than the substrate temperature. This method may be also regarded as a modification of the above-mentioned Japanese Laid-open Patent Application No. 63-33569. Also in this method, Al can be selectively grown only on a metal or semiconductor, but not only the difference between the gas temperature and the substrate surface temperature can be controlled with difficulty, but also there is the drawback that the bomb and the pipeline must be heated. Moreover, according to this method, there are involved such problems that no uniform continuous film can be formed, that flatness of the film is poor, etc., unless the film is made thick to some extent.

As set forth above, the prior art methods have the problems that it is difficult to obtain a flat Al—Si film of a low resistivity and good quality, that there is considerable limitation in apparatus and in film formation.

As described above, prior art methods cannot necessarily effect well selective growth of Al—Si, and even if possible, there is a problem with respect to flatness, resistance, purity, etc. of the Al film formed. Also, there has been involved the problem that the film formation method is complicated and can be controlled with difficulty.

Furthermore, according to the prior art as described above high throughput sufficient to get a final commercial success has not been achieved.

SUMMARY OF THE INVENTION

As described above, in the technical field or semiconductors in which higher integration has been desired in recent years, for providing inexpensively semiconductor devices which are made highly integrated and higher in performances, there have existed ample room for improvement.

An object of the present invention is to provide a deposited film formation method which is, excellent in controllability, requires particularly no expensive and complicated deposited film formation device, is extremely wide in general purpose applicability, and yet can form a metal film of quality, and a method for producing a semiconductor device.

An object of the present invention is to provide a deposited film formation method capable of forming a metal film composed mainly of Al of good quality according to the method excellent in reproducibility.

Another object of the present invention is to provide a method for preparing a semiconductor device, which can provide a highly integrated semiconductor device of high performance at low cost.

Another object of the present invention is to provide a deposited film formation method capable of forming a metal film composed mainly of Al of good quality at high deposition rate with excellent reproducibility at low cost.

Still another object of the present invention is to provide a method for preparing a semiconductor device, which can obtain a wiring of good quality at high through-put and is high in reliability.

Still another object of the present invention is to provide a deposited film formation method which can obtain a metal film composed mainly of Al of good quality at high deposition rate and with excellent selectivity, as well as a method for preparing a semiconductor device.

These objects are achieved in accordance with the invention by providing a process for forming a deposited film comprising the steps of:
 (a) providing a substrate having an electron donative surface in a space for formation of the deposited film;
 (b) introducing a gas of an alkyl aluminum hydride and hydrogen gas into said space for formation of deposited film; and
 (c) maintaining the temperature of said electron donative surface within the range of from the decomposition temperature of said alkyl aluminum hydride to 450° C. to form an aluminum film on said electron donative surface while varying the deposition speed of aluminum.

These objects are also achieved in accordance with the invention by providing a process for forming a deposited film comprising the steps of:
 (a) providing a substrate having an electron donative surface in a space for formation of the deposited film;
 (b) introducing a gas of an alkyl aluminum hydride, a gas containing silicon and hydrogen gas into said space for formation of deposited film; and
 (c) maintaining the temperature of said electron donative surface within the range of from the decomposition temperature of said alkyl aluminum hydride to 450° C. to form an aluminum-silicon film on said electron donative surface while varying the deposition speed of aluminum.

In the present invention, Al or Al—Si film is formed by feeding a gas of an alkyl aluminum hydride, or a gas of an alkyl aluminum hydride together with a gas containing silicon. In addition, the deposition rate of Al is shifted during film formation. Accordingly, a dense Al or Al—Si film can be formed on a substrate at high speed.

These objects are also achieved in accordance with the invention by providing a process for forming a deposited film comprising the steps of:
  (a) providing a substrate having an electron donative surface (A) and an electron non-donative surface (B) in a space for formation of the deposited film;
  (b) introducing a gas of an alkyl aluminum hydride and hydrogen gas into said space for formation of deposited film; and
  (c) maintaining the temperature of said electron donative surface (A) within the range of from the decomposition temperature of said alkyl aluminum hydride to 450° C. to form an aluminum film selectively on said electron donative surface (A) while varying the deposition speed of aluminum.

These objects are also achieved in accordance with the invention by providing a process for forming a deposited film comprising the steps of:
  (a) providing a substrate having an electron donative surface (A) and an electron non-donative surface (B) in a space for formation of the deposited film;
  (b) introducing a gas of an alkyl aluminum hydride, a gas containing silicon and hydrogen gas into said space for formation of deposited film; and
  (c) maintaining the temperature of said electron donative surface (A) within the range of from the decomposition temperature of said alkyl aluminum hydride to 450° C. to form an aluminum-silicon film selectively on said electron donative surface (A) while varying the deposition speed of aluminum.

In the present invention, by feeding a gas of an alkyl aluminum hydride or a gas of an alkyl aluminum hydride together with a gas containing silicon onto a substrate having an electron donative surface (A) and a non-electron donative surface (B), Al or Al—Si film is formed only on the electron donative surface (A) while shifting the deposition rate of Al during film formation. Accordingly, a dense Al or Al—Si film can be formed at high speed only on the electron donative surface (A) on the substrate.

BRIEF DESCRIPTION OF THE DRAWINGS

FIGS. 2 and 3 are schematic views for illustration of a suitable deposited film forming device in practicing the deposited film forming process according to the process of the present invention.

DETAILED DESCRIPTION OF THE PREFERRED EMBODIMENTS

Figure 1A:
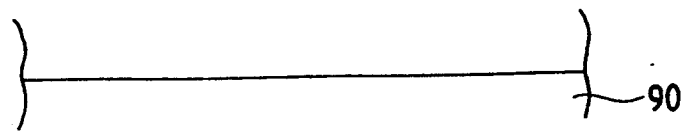
FIGS. 1A–1D are schematic sectional views for illustration of the deposited film forming process according to one embodiment of the present invention.

Preferred embodiments according to the present invention are described in detail below, but the present invention is not limited by these embodiments, and it may have a constitution which accomplishes the object of the present invention.

In the following, prior to detailed description, first, the process for forming a deposited film by use of an organic metal is outlined.

The decomposition reaction of an organic metal, and hence the thin film deposition reaction will vary greatly depending on the kind of the metal atom, the kind of the alkyl bonded to the metal atom, the means of causing the decomposition reaction to occur, the atmospheric gas, etc.

For example, in the case of M—R$_3$ (M: the group III metal, R: alkyl group), trimethyl gallium:

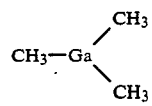

in thermal decomposition undergoes radical cleavage wherein Ga—CH$_3$ bond is cleaved, while triethyl gallium:

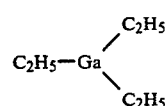

in thermal decomposition is decomposed through β-elimination into:

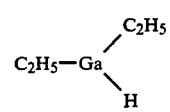

and C$_2$H$_4$. On the other hand, triethyl aluminum attached with the same ethyl group:

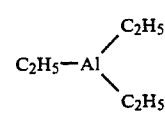

in thermal decomposition undergoes radical decomposition in which Al—C₂H₅ is cleaved. However, tri-isobutyl aluminum having iC₄H₉ bonded therein:

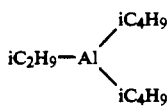

is subject to β-elimination.

Trimethyl aluminum (TMA) comprising CH₃ groups and Al has a dimer structure at room temperature:

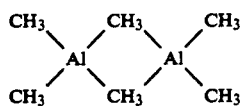

and thermal decomposition is radical decomposition in which Al—CH₃ group is cleaved, and at a temperature of 150° C. or lower, it reacts with atmospheric H₂ to form CH₄, and forms finally Al.

However, at a high temperature of 300° C. or higher, even if H₂ may be present in the atmosphere, CH₃ group will withdraw H from the TMA molecule, until finally Al—C compound is formed.

Also, in the case of TMA, in light or a certain region controlled in electric power in H₂ atmosphere high frequency (ca. 13.56 MHz) plasma, C₂H₆ will be formed by the bridging CH₃ between two Al's.

In essence, since even an organic metal comprising CH₃ group which the simplest alkyl group, C₂H₅ group or iC₄H₉ group and Al or Ga has a reaction mode depending on the kind of the alkyl group, the kind of the metal atom, the excitation decomposition means, for deposition of a metal atom from an organic metal on a desired substrate, the decomposition reaction must be strictly controlled. For example, when Al is to be deposited from triisobutyl aluminum:

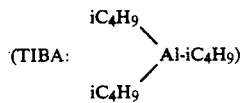

in the low pressure CVD method comprising mainly thermal reaction, unevenness of Mm order is formed on the surface, whereby the surface morphology is inferior. Also, hillock generation by heat treatment, Si surface roughening through Si diffusion at the interface between Al and Si occur, and also migration resistance is inferior, whereby it can be utilized for ultra-LSI process with difficulty.

For this reason, a method for controlling precisely both the gas temperature and the substrate temperature has been attempted. However, the device is complicated, and the method is of the sheet treatment type in which deposition can be effected only on one wafer by one deposition process. Besides, since the deposition speed is 500 Å/min. at the highest, the throughput necessary for bulk production cannot be realized.

Similarly, when TMA is employed, Al deposition has been attempted by use of plasma or light, the device also becomes complicated due to use of plasma or light, and also because of the sheet type device, there remains room for improvement for sufficient improvement of throughput.

Dimethyl aluminum hydride (DMAH) as the alkyl aluminum hydride to be utilized in the present invention is a substance known as alkyl metal, but it could not be estimated at all what Al thin film could be deposited depending on what reaction mode, unless deposited films are formed under all the conditions. For example, in an example of deposition Al by optical CVD from DMAH, the surface morphology is inferior, and the resistivity value was greater than the bulk value (2.7 μohm·cm) as several μohm to 10 μohm·cm, thus being inferior in film quality.

Now, referring to the drawings, preferred embodiments of the present invention are described in more detail.

In the present invention, for depositing an Al—Si film of good quality as the electroconductive deposition film on a substrate, the CVD method is used.

More specifically, by use of dimethyl aluminum hydride (DMAH):

Chemical formula: 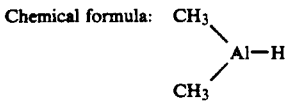

or monomethyl aluminum hydride (MMAH₂):

Chemical formula: 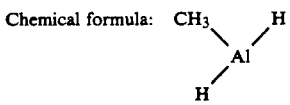

as alkyl aluminum hydride which is an organic metal as the starting gas containing at least one atom which becomes the constituent of the deposited film, optionally a gas containing Si atoms as the starting gas and H₂ as the reaction gas, an Al—Si film is formed by gas phase growth with a gas mixture of these on a substrate.

As the substrate applicable in the present invention, a material having electron donative property may be employed.

The electron donative material is described in detail below.

The electron donative material refers to one having free electrons existing or free electrons intentionally formed in the substrate, for example, a material having a surface on which the chemical reaction is promoted through give-and-take of electrons with the starting gas molecules attached on the substrate surface. For example, generally metals and semiconductors such as P type, N type and intrinsic semiconductor etc. correspond to such material. Those having very thin oxidized film on the metal or semiconductor surface are also included. For, with such thin film, the chemical reaction can occur between the substrate and the attached starting molecules.

Specifically, there may be included semiconductors such as monocrystalline silicon, polycrystalline silicon, amorphous silicon, etc., binary system or ternary system or quaternary system III–V compound semiconductors comprising combinations of Ga, In, Al as the group III element and P, As, N as the group V element, or II–IV compound semiconducters, or metals themselves such as tungsten, molybdenum, tantalum, aluminum, titanium, copper, etc., or silicides of the above metals such as tungsten silicide, molybdenum silicide, tantalum silicide, aluminum silicide, titanium silicide, etc., further metals containing either one of the constituent of the above metals such as aluminum silicon, aluminum titanium, aluminum copper, aluminum tantalum, aluminum silicon copper, aluminum silicon titanium, aluminum palladium, titanium nitride, etc.

On the substrate with such constitution, Al is deposited only through simple thermal reaction in the reaction system of the starting gas and $H_2$. For example, the thermal reaction in the reaction system between DMAH and $H_2$ may be basically considered as follows:

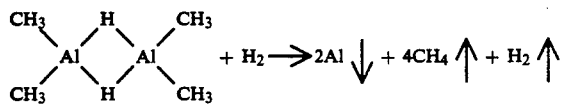

DMAH assumes a dimer structure at room temperature. Also, with $MMAH_2$, a high quality Al film could be formed by thermal reaction as shown below in Examples.

Since $MMAH_2$ has low vapor pressure as 0.01 to 0.1 Torr at room temperature, a large amount of the starting material can be transported with difficulty, and the upper limit value of the deposition speed is several hundred Å/min. in the present embodiment, and preferably, it is most desirable to use DMAH of which vapor pressure is 1 Torr at room temperature.

In another embodiment of the present invention, the CVD method is used for selective deposition of a good metal film as the electroconductive deposition film on the substrate.

More specifically, as described above, by use of dimethyl aluminum hydride (DMAH) or monomethyl aluminum hydride ($MMAH_2$), optionally a gas containing Si atoms as the starting gas and $H_2$ as the reaction gas, a metal film is selectively formed on the substrate by gas phase growth with a gas mixture of these.

The substrate applicable in the present invention has a first substrate surface material for formation of the surface on which a metal is deposited, and a second substrate surface material on which no metal is deposited. And, as the first substrate surface material, a material having the electron donative surface is used.

In contrast, as the material for forming the surface on which pure Al or Al—Si is not deposited selectively, namely the material for forming the electron non-donative surface, conventional insulating materials, oxidized silicon formed by thermal oxidation, CVD, etc., glass or oxidized film such as BSG, PSG, BPSG, etc., thermally nitrided film, silicon nitrided film by plasma CVD, low pressure CVD, ECR-CVD method, etc.

FIGS. 1A-1D show how the pure Al or Al—Si film according to the present invention is grown.

FIG. 1A is an illustration showing schematically the cross-section of the substrate before formation of the pure Al deposited film according to the present invention. 90 is the substrate comprising an electron donative material.

Figure 1B:
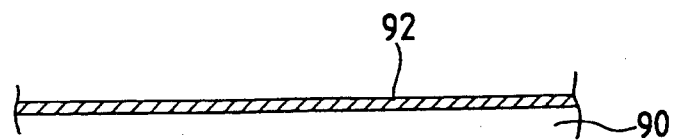

When DMAH, optionally together with $Si_2H_6$ as starting gas and a gas mixture containing $H_2$ as reaction gas are fed onto the substrate 1 heated under the first deposition condition, pure Al or Al—Si is precipitated on the substrate 90 to form the continuous film of pure Al or Al—Si as shown FIG. 1B.

Figure 1C:
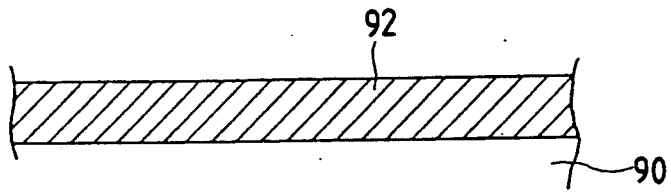
Figure 1D:
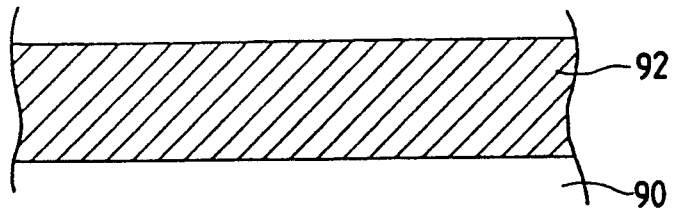

Further deposition of Al—Si is continued under the second deposition condition to obtain Al—Si film as shown in FIG. 1D via the state of FIG. 1C.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 2.7-3.0 $\mu$ohm·cm at room temperature which is substantially equal to the bulk resistivity of Al, and becomes continuous and flat film. Also, even with a film thickness of 1 $\mu$m, its resistance at room temperature is approximately 2.7-3.0 $\mu$ohm·cm and a sufficiently dense film is formed with a relatively thicker film. The reflectance in the visible wavelength region is approximately 80%, and a thin film with excellent surface flatness can be deposited.

As described in detail above, in the present invention, in addition to the finding of depositing pure Al on an electron donative surface (A) by maintaining the electron donative surface at a temperature between of the decomposition temperature of an alkyl aluminum hydride and 450° C. in a gas mixture atmosphere of a gas of an alkyl aluminum hydride, particularly an alkyl aluminum hydride containing methyl group and the hydrogen gas, or depositing Al—Si by use of the above-mentioned gas mixture atmosphere in which a gas containing Si is further added, for effecting higher throughput in formation of pure Al or Al—Si film, during the deposited film formation, shift from the low deposition rate to the high deposition rate is effected. By doing so, higher through-put can be accomplished without lowering film quality.

Figure 2:
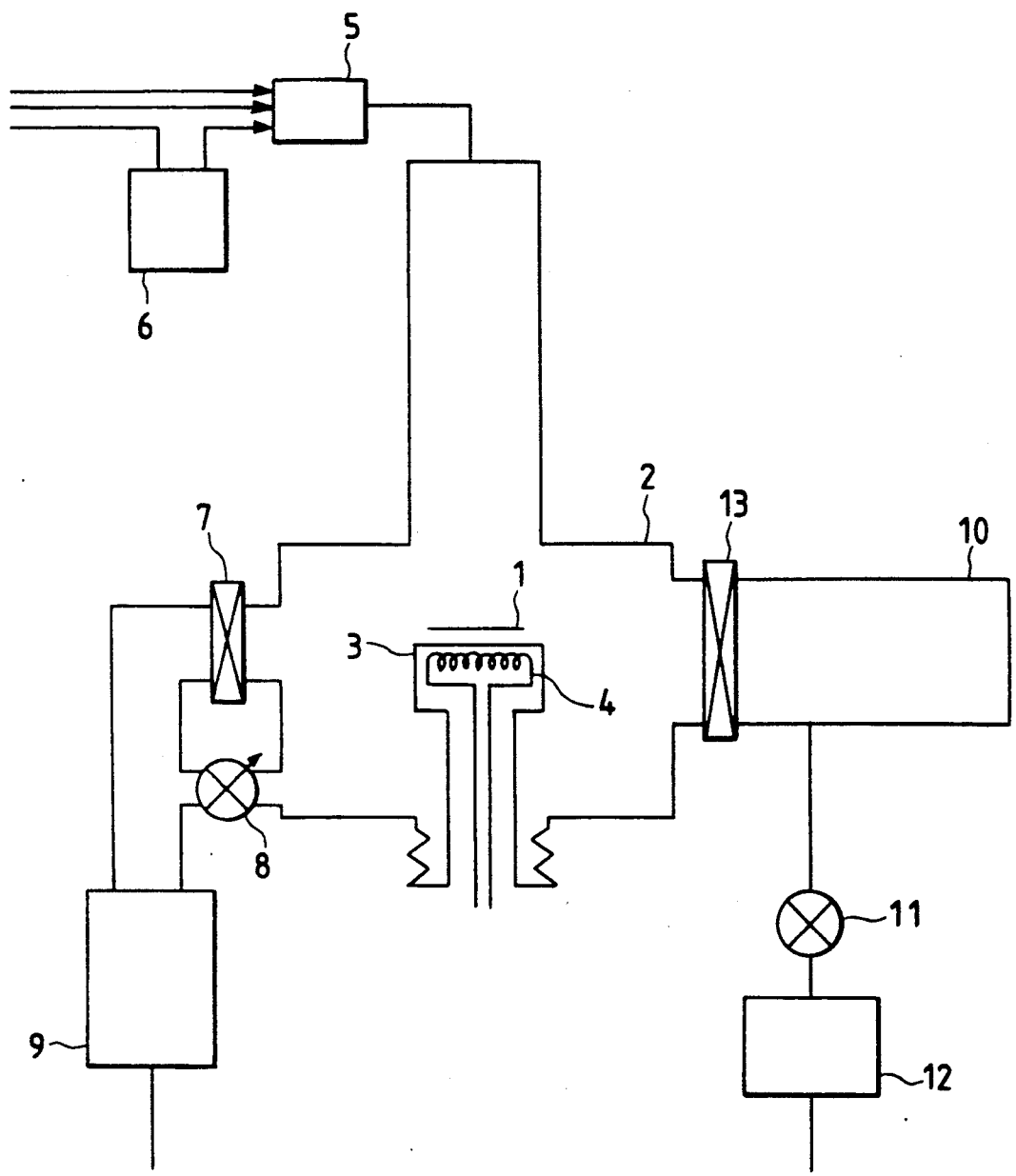

FIG. 2 is a schematic view showing a preferable deposition film forming device for applying the present invention.

Here, 1 is a substrate for forming an Al—Si film. The substrate 1 is mounted on a substrate holder 3 provided internally of the reaction tube 2 for forming a space for formation of a deposited film which is substantially closed to FIG. 2. As the material constituting the reaction tube 2, quartz is preferable, but it may be also made of a metal. In this case, it is preferable to cool the reaction tube. The substrate holder 3 is made of a metal, and is provided with a heater 4 so that the substrate mounted thereon can be heated. And, the constitution is made so that the substrate temperature can be controlled by controlling the heat generation temperature of the heater 4.

The feeding system of gases is constituted as described below.

5 is a gas mixer, in which the first starting gas, the second starting gas and the reaction gas are mixed, and the mixture is fed into the reaction tube 2. 6 is a starting gas gasifier provided for gasification of an organic metal as the first starting gas.

The organic metal to be used in the present invention is liquid at room temperature, and is formed into saturated vapor by passing a carrier gas through the liquid of the organic metal within the gasifier 6, which is in turn introduced into the mixer 5.

The evacuation is constituted as described below.

7 is a gate valve, which is opened when performing evacuation of a large volume such as during evacuation internally of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is constituted of a pump for evacuation such as turbo molecular pump, etc.

The conveying system of the substrate 1 is constituted as described below.

10 is a substrate conveying chamber which can house the substrate before and after formation of the deposited film, which is evacuated by opening the valve 11. 12 is an evacuation unit for evacuating the conveying chamber, which is constituted of a pump for evacuation such as turbo molecular pump, etc.

The valve 13 is opened only when the substrate 1 is transferred between the reaction chamber and the conveying space.

As shown in FIG. 1, in the starting gas gasifier 6 which is the gas formation chamber for forming the starting gas, the liquid DMAH maintained at room temperature is bubbled with $H_2$ or Ar (or other inert gas) as the carrier gas to form gaseous DMAH, which is transported to the mixer 5. The $H_2$ gas as the reaction gas is transported through another route into the mixer 5. The gases are controlled in flow rates so that the respective partial pressures may become desired values.

In the case of forming a film by this device, the first starting gas may be of course $MMAH_2$, but DMAH with a vapor pressure enough to become 1 Torr at room temperature is the most preferred. Also, DMAH and $MMAH_2$ may be used in a mixture.

As the second starting gas containing Si, there can be used $Si_2H_6$, $SiH_4$, $Si_3H_8$, $Si(CH_3)_4$, $SiCl_4$, $SiH_2Cl_2$ and $SiH_3Cl$. Of these compounds, $Si_2H_6$ which can be easily decomposed at the low temperature of 200° –300° C. The gases such as $Si_2H_6$ are diluted with $H_2$ or Ar and transported to the mixer 5 through a system other than the DMAH system.

The deposited film formed at a substrate temperature of 160° C. to 450° C. by use of such starting gas and reaction gas, with a thickness of for example 400 Å, has a resistivity at room temperature of 2.7–3.0 $\mu$ohm·cm which is substantially equal to Al bulk resistivity, and is a continuous and flat film. At this time, the pressure during film formation can be chosen within the range from $10^{-3}$ Torr to 760 Torr. Also, even when the film thickness may be 1 $\mu$m, its resistivity is about 2.7–3.0 $\mu$ohm·cm, and a sufficiently dense film can be formed also with a relatively thicker film. Also, the reflectance in the visible light wavelength region is approximately 80%, whereby a thin film excellent in surface flatness can be deposited.

The substrate temperature is desirably the decomposition temperature of the starting gas containing Al or higher, and 450° C. or lower as described above, but specifically the substrate temperature of 200° to 450° C. is more desirable, and when deposition is carried out under this condition, by making the DMAH partial pressure $10^{-4}$ to $10^{-3}$ Torr, the deposition speed becomes very great as 100 Å/min. to 800 Å/min., whereby sufficient great deposition speed corresponding to the cost as the Al—Si deposition technique for ultra-LSI can be obtained.

A more preferable substrate temperature condition is 270° C. to 350° C., and the Al—Si film deposited under this condition is also strongly orientatable and, even when subjected to the heat treatment at 450° C. for 1 hour, the Al—Si film on the Si monocrystalline or Si polycrystalline substrate becomes a good Al—Si film without generation of hillock, spike as seen in the film forming method of the prior art. Also, such Al—Si film is excellent in electro-migration resistance.

In the device shown in FIG. 2, Al—Si can be deposited on only one sheet of substrate in deposition for one time. Although a deposition speed of about 800 Å/min. can be obtained, it is still insufficient for performing deposition of a large number of sheets within a short time.

As the deposition film forming device for improving this point, there is the low pressure CVD device which can deposit Al—Si by simultaneous mounting of a large number of sheets of wafer. Since the Al—Si film formation according to the present invention utilizes the surface reaction on the electron donative substrate surface, in the hot wall type low pressure CVD method wherein only the substrate is heated, Al—Si compound containing 0.5–2.0% of Si can be deposited on the substrate by use of DMAH and $H_2$ and the Si starting gas such as $Si_2H_6$, etc.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$ fold to $1.3 \times 10^{-3}$-fold of the pressure in the reaction tube, the $Si_2H_6$ partial pressure $1 \times 10^{-7}$ fold to $1 \times 10^{-4}$-fold of the pressure in the reaction tube, and under such conditions, Al—Si can be well deposited on the electron donative substrate.

FIG. 3 is a schematic illustration showing a deposited film forming device to which such present invention is applicable.

57 is a substrate for formation of Al—Si film. 50 is an outside reaction tube made of quartz for forming a space for formation of deposited film substantially closed to the surrounding, 51 an innerside reaction tube made of quartz located for separating the flow of gas within the outside reaction tube 50, 54 a flange made of a metal for opening and closing of the opening of the outside reaction tube 50, and the substrate 57 is located within the substrate holding member 56 provided internally of the innerside reaction tube 51. The substrate holding member 56 should be preferably made of quartz.

Also, in the present device, the substrate temperature can be controlled by the heater portion 59. The pressure internally of the reaction tube 50 is constituted so as to be controllable by the evacuation system connected through the gas evacuation outlet 53.

The gas feeding system is constituted to have a first gas system, a second gas system, a third gas system and a mixer (none are shown in FIG. 3) similarly as the device shown by the symbols 5 and 6 in FIG. 2, and the starting gases and the reaction gas are introduced into the reaction tube 50 through the starting gas inlet 52. These gases react on the surface of the substrate 57 during passage internally of the innerside reaction tube 51 as shown by the arrowhead 58 in FIG. 3 to deposit Al—Si on the substrate surface. The gases after the reaction pass through the gap formed between the innerside reaction tube 51 and the outside reaction tube 50, and evacuated through the gas evacuation outlet 53.

In taking out and in the substrate, the flange 54 made of a metal is permitted to fall by an elevator (not shown) together with the substrate holding member 56 and the substrate 57 to be moved to a predetermined position where the substrate is mounted and detached.

By forming a deposited film under the conditions as described above by use of such device, Al—Si films of good quality can be formed in all the wafers within the device.

When depositing Al—Si by use of the device shown in FIG. 2, as an example, under the conditions of:
Torr pressure: 1.5 Torr
DMAH partial pressure: $1.5 \times 10^{-4}$ Torr
Si containing gas partial pressure: $2.0 \times 10^{-6}$ Torr
Substrate temperature: 160° C. - 450° C.,
an Al—Si film can be deposited on the electron donative material surface. Even with a film thickness of 400 Å, the film is continuous and its resistivity is 2.7-3.0 $\mu\Omega$·cm which substantially equal to the bulk value of Al. When the substrate temperature is 270° C. - 350° C., the deposition rate is 100-800 Å/min., and for high speed deposition, the deposition rate is required to be made larger. In the case of depositing pure Al, silicon containing gas is omitted.

For realizing high speed deposition, it may be conceivable to make the substrate temperature higher and DMAH partial pressure higher. For example, by making the substrate temperature 330° C., and the DMAH partial pressure $10^{-2}$ to $10^{-3}$ Torr, a deposition rate of 0.2 to 0.5 $\mu$m/min. can be realized. However, if the deposition rate is too large, the probability becomes higher that a surface inferior in surface flatness will be obtained. For example, the probability becomes higher that a pure Al or Al—Si film with a reflectance of about 10 to 30% will be obtained. The reason why a film inferior in surface flatness is thus obtained may be considered to be due to the fact that surface migration of metal atoms or molecules are great at a high temperature, whereby deposition proceeds only at specific nuclei to deteriorate surface flatness when becoming a film thickness. Thus, the greatest reasons is that, at the initial stage of deposition, a film with inferior surface flatness is formed, which exerts deleterious influences even afterwards.

In the present invention, as the means for shifting from low deposition rate to high deposition rate during deposited film formation, for example, the method of varying the substrate temperature and the starting gas partial pressure is used to provide a method of obtaining pure Al or Al—Si deposited film of high quality and excellent in flatness at substantially high deposition rate.

By doing so, a deposited film which has substantially high deposition rate and is also flat with high quality can be obtained.

In the deposited film formation by the surface chemical reaction according to the present invention, it appears that even a thin film becomes a continuous and high quality film under the condition of lower deposition rate under lower substrate temperature and lower starting gas partial pressure, provided that there is no contamination from the reaction tube.

According to the knowledges by the present inventors, a deposited film of pure Al or Al—Si of good quality can be formed under good selectivity at a substrate temperature of 160° to 450° C., more preferably 270° to 350° C.

Accordingly, in the first deposition step in the present invention, namely the deposited film formation step at low deposition rate, under a total pressure of $10^{-3}$ Torr to 760 Torr, preferably $5 \times 10^{-2}$ Torr to 5 Torr, the substrate temperature is suitably chosen from 270° to 350° C., preferably 270° to 300° C., and the DMAH partial pressure from $1.3 \times 10^{-5}$ to $1.3 \times 10^{-3}$-fold, preferably $1.3 \times 10^{-5}$ to $1.3 \times 10^{-4}$-fold of the total pressure. In the second deposition step in the present invention, namely the deposited film formation step at high deposition rate, under a total pressure of $10^{-3}$ Torr to 760 Torr, preferably $5 \times 10^{-2}$ to 5 Torr, the substrate temperature is made 270° to 350° C., preferably 300° to 350° C., and the DMAH partial pressure $1.3 \times 10^{-5}$ to $1.3 \times 10^{-3}$-fold of total pressure.

For elevating the substrate temperature, instead of using only a heater, the substrate temperature may be quickly elevated by irradiation of W lamp or Xe lamp on the wafer surface. Heating by a lamp is effective for quick elevation of the substrate temperature.

Specifically, the DMAH partial pressure is suitably selected from the condition of $1.3 \times 10^{-4}$ to $1.3 \times 10^{-3}$-fold of the total pressure, so that a deposited film may be formed at a higher deposition rate than in the deposition rate in the first step as mentioned above. For example, under the same total pressure, with the substrate temperature being made constant, the partial pressure of DMAH may be increased, or with the DMAH partial pressure being constant, the substrate temperature may be elevated. Of course under the same total pressure, both of the substrate temperature and the partial pressure may be elevated.

For example, it is preferable to deposit a continuous film of 100 to 200 Å within the range of a substrate temperature from 270° to 300° C. in the first deposition step under the above mentioned pressure conditions, and then form the film at an increased deposition rate of, for example, 0.1 to 1 $\mu$m/min. by increasing the substrate temperature to 300° to 350° C. The deposited film thus formed becomes a film of good quality with surface migration being inhibited.

By varying the deposition conditions as described above, a continuous, flat and high quality film of 100 to 200 Å is formed within a deposition time of 1 to 5 minutes under the first deposition conditions, while under the second deposition conditions, since a continuous and flat pure Al (or Al—Si) has been already formed, a flat and high quality thin film can be formed even if pure Al (or Al—Si) may be deposited at a high deposition rate of 0.1 to 1 $\mu$m/min.

A pure Al film or Al—Si film of 1 $\mu$m thickness can be sufficiently formed by deposition for 1 to 5 minutes under the first conditions, and with the deposition time for 1 to 3 minutes under the second conditions.

In the device shown in FIG. 2, pure Al or Al—Si can be deposited only on one sheet of substrate in deposition at one time.

The method according to the present invention is also applicable to the reduced-pressure CVD device for a number of sheets as shown in FIG. 3. Since deposition according to the present invention employs the surface reaction at the heated electron donative substrate surface, according to the hot wall type reduced-pressure CVD method in which only the substrate is heated, an Al—Si containing 0.5 to 2.0% of Si can be deposited at high speed by addition of DMAH and H$_2$, and an Si starting gas such as Si$_2$H$_6$, etc., if necessary.

When a reduced pressure CVD device is used, the reaction tube pressure may be 0.05 to 760 Torr, desirably 0.1 to 0.8 Torr. As the first deposition conditions, the substrate temperature may be 270° to 350° C., desirably 270° to 300° C., and the DMAH partial pressure may be $1.3 \times 10^{-5}$ to $1.3 \times 10^{-3}$-fold, desirably $1.3 \times 10^{-5}$ to $1.3 \times 10^{-4}$ of the reaction tube pressure. As the second deposition conditions, the substrate temperature is made 270° to 350° C., preferably 300° to 350° C., and the DMAH partial pressure $1.3 \times 10^{-5}$ to $1.3 \times 10^{-3}$, preferably $1.3 \times 10^{-4}$ to $1.3 \times 10^{-3}$-fold of the partial pressure reaction tube. The $Si_2H_6$ partial pressure, in both the first and the second deposition conditions, may be within the range of $1 \times 10^{-7}$ to $1 \times 10^{-4}$-fold of the reaction tube pressure, whereby Al—Si is deposited at high speed on the electron donative surface.

By forming a deposited film under the conditions as described above by use of such device, Al—Si films of good quality can be formed in all the wafers within the device.

According to the present invention, in the initial stage of deposition, a continuous and dense pure Al or Al—Si is formed, and therefore even pure Al or Al—Si may be deposited thereafter at high speed deposition conditions of 0.2 to 1 μm/min., film quality such as surface flatness, etc. will not be deteriorated, but pure Al or Al—Si film of high quality can be deposited at a high speed practically effectively.

Even if deposited at a high speed, the film obtained is dense with little amount of impurity such as carbon, etc. contained, its resistance is similar to that of bulk, and also surface flatness is extremely high. The deposited film, in spite of deposition at high speed, has the specific features as mentioned below:

(1) reduction of hillock,
(2) improvement of electromigration resistance,
(3) reduction of alloy pit at the contact portion,
(4) improvement of surface flatness,
(5) improvement of resistance within via-hole and contact resistance,
(6) lowering the temperature of heat treatment during wiring step.

Since Al—Si film of high quality can be deposited at high speed, the through-put in the ultra-LSI process is dramatically improved. In the low pressure CVD device as shown in FIG. 3, Al—Si can be deposited at the same time on 100 to 200 sheets of 4 inch wafer, and the effect of high speed deposition contributes greatly to the improvement of through-put. In ultra-LSI in the future, the wafer to be used will be made to have a size of 6 or 8 inch. When the wafer size becomes as large as 6 inch or 8 inch, the low pressure CVD device as shown in FIG. 3 can be practically applied with difficulty, because the reaction tube diameter becomes larger. However, the sheet type CVD device as shown in FIG. 2 are very advantageous in enlargement of wafer, because the size of the device as a whole will not change greatly even if the wafer size may become larger. However, in Al-deposition according to the CVD method of the prior art, no high speed deposition of 0.2 to 1 μm/min-cannot be realized, and therefore it could be employed with difficulty even if a deposited film of high quality was formed. However, by use of the deposition method according to the present invention, Al-Si of high quality can be deposited at high speed of 0.2 to 1 μm/min., and particularly the meaning fulfilled by the present invention in a sheet type CVD device corresponding to 6 inch or 8 inch demanded for high throughput is very important.

FIGS. 4A–4E show how the Al or Al—Si film according to the present invention is selectively grown in the via-hole.

Figure 4A:
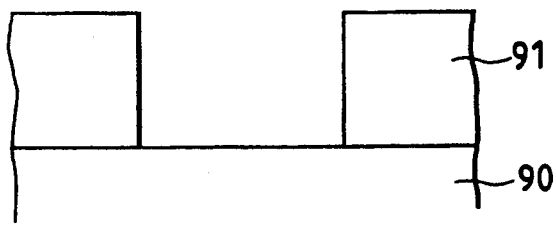
FIGS. 4A–4E are schematic sectional views for illustration of the deposited film forming process according to one embodiment of the present invention.

FIG. 4A is an illustration showing schematically the cross-section of the substrate before formation of the deposited film according to the present invention. 90 is the substrate comprising an electron donative material, and 91 a thin film comprising an electron non-donative material.

Figure 4B:
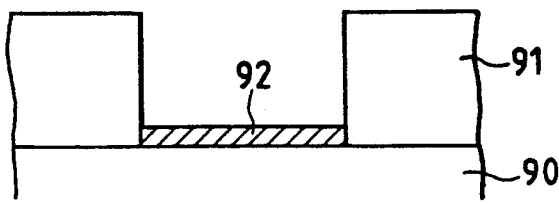

When DMAH, optionally together with $Si_2H_6$ as starting gas and a gas mixture containing $H_2$ as reaction gas are fed onto the substrate 1 heated under the first deposition condition, pure Al or Al—Si is precipitated on the substrate 90 to form the continuous film of pure Al or Al—Si as shown FIG. 4B.

Figure 4C:
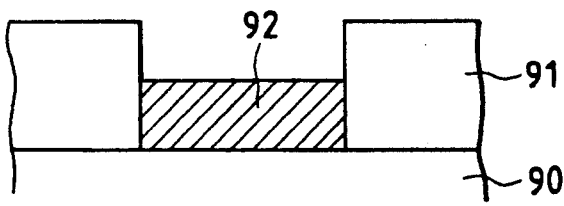
Figure 4D:
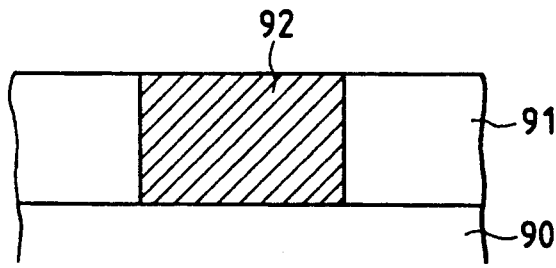
Figure 4E:
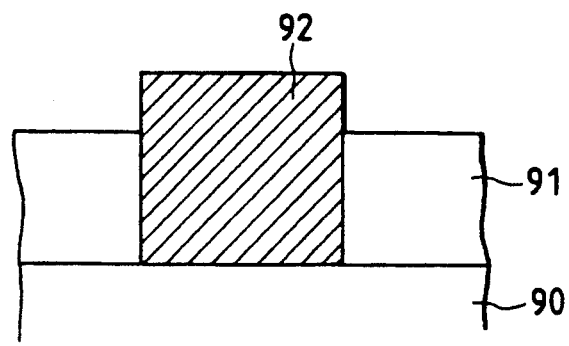

When deposition of Al—Si is continued under the second deposition conditions, via the state of FIG. 4C, the film grows to the level of the uppermost portion of the thin film 91 as shown in FIG. 4D. Further, when grown under the same conditions, as shown in FIG. 4E, the Al—Si film can grow to 5000 Å substantially without growth in the lateral direction. This is the most characteristic point of the deposited film obtained by the present invention, and it will be understood how a film of good quality can be formed under good selectivity.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 2.7–3.0 μohm·cm at room temperature which is substantially equal to the bulk resistivity of Al, and becomes continuous and flat film. Also, even with a film thickness of 1 μm, its resistance at room temperature is approximately 2.7–3.0 μohm·cm and a sufficiently dense film is formed with a relatively thicker film. The reflectance in the visible wavelength region is approximately 80%, and a thin film with excellent surface flatness can be deposited.

As described in detail above, in the present invention, in addition to the finding that pure Al is deposited selectively on an electron donative surface (A) by maintaining the electron donative surface (A) at a temperature between the decomposition temperature of an alkyl aluminum hydride and 450° C. in a gas mixture atmosphere of the alkyl aluminum hydride and hydrogen gas, or Al—Si is selectively deposited by use of the above gas mixture in which a gas containing Si is further added, for effecting higher through-put in formation of pure Al or Al—Si film, the deposition rate is shifted from a low deposition rate to a high deposition rate during the deposited film formation. By doing so, higher through-put can be attained without deterioration of film quality.

When depositing Al—Si by use of the device shown in FIG. 2, as an example, under the conditions of:
Total pressure: 1.5 Torr
DMAH partial pressure: $1.5 \times 10^{-4}$ Torr
Si containing gas partial pressure: $2.0 \times 10^{-6}$ Torr
Substrate temperature: 160° C. - 450° C.,
an Al—Si film can be selectively deposited only on the electron donative material surface. Even with a film thickness of 400 Å, the film is continuous and its resistivity is 2.7–3.0 $\mu\Omega$·cm which substantially equal to the bulk value of Al. When the substrate temperature is 270° C. - 350° C., the deposition rate is 100 - 800 Å/min., and for high speed deposition, the deposition rate is required to be made larger.

For realizing high speed deposition, it may be conceivable to make the substrate temperature higher and DMAH partial pressure higher. For example, by making the substrate temperature 330° C., and the DMAH partial pressure $10^{-2}$ to $10^{-3}$ Torr, a deposition rate of 0.2 to 0.5 µm/min. can be realized. However, if the deposition rate is too large, the probability becomes higher that a surface inferior in surface flatness will be obtained. For example, the probability becomes higher that a pure Al or Al—Si film with a reflectance of about 10 to 30% will be obtained. The reason why a film inferior in surface flatness is thus obtained may be considered to be due to the fact that surface migration of metal atoms or molecules are great at a high temperature, whereby deposition proceeds only at specific nuclei to deteriorate surface flatness when becoming a film thickness. Thus, the greatest reasons is that, at the initial stage of deposition, a film with inferior surface flatness is formed, which exerts deleterious influences even afterwards.

In the present invention, as the means for shifting from low deposition rate to high deposition rate during deposited film formation, for example, the method of varying the substrate temperature and the starting gas partial pressure is used to provide a method of obtaining pure Al or Al—Si deposited film of high quality and excellent in flatness at substantially high deposition rate.

By doing so, a deposited film which has substantially high deposition rate and is also flat with high quality can be obtained.

In the deposited film formation by the surface chemical reaction according to the present invention, it appears that even a thin film becomes a continuous and high quality film under the condition of lower deposition rate under lower substrate temperature and lower starting gas partial pressure, provided that there is no contamination from the reaction tube.

According to the knowledges by the present inventors, a deposited film of pure Al or Al—Si of good quality can be formed under good selectivity at a substrate temperature of 160° to 450° C., more preferably 270° to 350° C.

Accordingly, in the first deposition step in the present invention, namely the deposited film formation step at low deposition rate, under a total pressure of $10^{-3}$ Torr to 760 Torr, preferably $5\times 10^{-2}$ Torr to 5 Torr, the substrate temperature is suitably chosen from 270 to 350° C., preferably 270° to 300° C., and the DMAH partial pressure from $1.3\times 10^{-5}$ to $1.3\times 10^{-3}$-fold, preferably $1.3\times 10^{-5}$ to $1.3\times 10^{-4}$-fold of the total pressure. In the second deposition step in the present invention, namely the deposited film formation step at high deposition rate, under a total pressure of $10^{-3}$ Torr to 760 Torr, preferably $5\times 10^{-2}$ to 5 Torr, the substrate temperature is made 270° to 350° C., preferably 300° to 350° C., and the DMAH partial pressure $1.3\times 10^{-5}$ to $1.3\times 10^{-3}$-fold of total pressure.

For elevating the substrate temperature, instead of using only a heater, the substrate temperature may be quickly elevated by irradiation of W lamp or Xe lamp on the wafer surface. Heating by a lamp is effective for quick elevation of the substrate temperature.

Specifically, the DMAH partial pressure is suitably selected from the condition of $1.3\times 10^{-4}$ to $1.3\times 10^{-3}$-fold of the total pressure, so that a deposited film may be formed at a higher deposition rate than in the deposition rate in the first step as mentioned above. For example,, under the same total pressure, with the substrate temperature being made constant, the partial pressure of DMAH may be increased, or with the DMAH partial pressure being constant, the substrate temperature may be elevated. Of course under the same total pressure, both of the substrate temperature and the partial pressure may be elevated.

For example, it is preferable to deposit a continuous film of 100 to 200 Å within the range of a substrate temperature from 270° to 300° C. in the first deposition step under the above-mentioned pressure conditions, and then form the film at an increased deposition rate of, for example, 0.1 to 1 µm/min.by increasing the substrate temperature to 300° to 350° C. The deposited film thus formed becomes a film of good quality with surface migration being inhibited.

By varying the deposition conditions as described above, a Continuous, flat and high quality film of 100 to 200 Å is formed within a deposition time of 1 to 5 minutes under the first deposition conditions, while under the second deposition conditions, since a continuous and flat pure Al (or Al—Si) has been already formed, a flat and high quality thin film can be formed even if pure Al (or Al—Si) may be deposited at a high deposition rate of 0.1 to 1 µm/min.

A Al film of 1 µm thickness can be sufficiently formed by deposition for 1 to 5 minutes under the first conditions, and with the deposition time for 1 to 3 minutes under the second conditions.

In the device shown in FIG. 2, Al—Si can be deposited only on one sheet of substrate in deposition at one time.

The method according to the present invention is also applicable to the reduced-pressure CVD device for a number of sheets as shown in FIG. 3. Since Al—Si deposition according to the present invention employs the surface reaction at the heated electron donative substrate surface, according to the hot wall type reduced-pressure CVD method in which only the substrate is heated, an Al—Si containing 0.5 to 2.0% of Si can be deposited at high speed by addition of DMAH and $H_2$; and an Si starting gas such as $Si_2H_6$, etc., if necessary.

When a reduced pressure CVD device is used, the reaction tube pressure may be 0.05 to 760 Torr, desirably 0.1 to 0.8 Torr. As the first deposition conditions, the substrate temperature may be 270° to 350° C., desirably 270° to 300° C., and the DMAH partial pressure may be $1.3\times 10^{-5}$ to $1.3\times 10^{-3}$-fold, desirably $1.3\times 10^{-5}$ to $1.3\times 10^{-4}$ of the reaction tube pressure. As the second deposition conditions, the substrate temperature is made 270° to 350° C., preferably 300° to 350° C., and the DMAH partial pressure $1.3\times 10^{-5}$ to $1.3\times 10^{-3}$, preferably $1.3\times 10^{-4}$ to $1.3\times 10^{-3}$-fold of the partial pressure reaction tube. The $Si_2H_6$ partial pressure, in both the first and the second deposition conditions, may be within the range of $1\times 10^{-7}$ to $1\times 10^{-4}$-fold of the reaction tube pressure, whereby Al—Si is deposited at high speed on the electron donative surface.

According to the present invention, in the initial stage of deposition, a continuous and dense Al—Si is formed, and therefore even Al—Si may be deposited thereafter at high speed deposition conditions of 0.2 to 1 µm/min., film quality such as surface flatness, etc. will not be deteriorated, but Al—Si film of high quality can be deposited at a high speed practically effectively.

Even if Al—Si film deposited at a high speed, the film obtained is dense with little amount of impurity such as carbon, etc. contained, its resistance is similar to that of bulk, and also surface flatness is extremely high. The deposited Al—Si film, in spite of deposition at high speed, has the specific features as mentioned below:

(1) reduction of hillock,
(2) improvement of electromigration resistance,
(3) reduction of alloy pit at the contact portion,
(4) improvement of surface flatness,
(5) improvement of resistance within via-hole and contact resistance,
(6) lowering the temperature of heat treatment during wiring step.

Since Al—Si film of high quality can be deposited at high speed, the through put in the ultra-LSI process is dramatically improved. In the low pressure CVD device as shown in FIG. 3, Al—Si can be deposited at the same time on 100 to 200 sheets of 4 inch wafer, and the effect of high speed deposition contributes greatly to the improvement of through-put. In ultra-LSI in the future, the wafer to be used will be made to have a size of 6 or 8 inch. When the wafer size becomes as large as 6 inch or 8 inch, the low pressure CVD device as shown in FIG. 3 can be practically applied with difficulty, because the reaction tube diameter becomes larger. However, the sheet type CVD device as shown in FIG. 2 are very advantageous in enlargement of wafer, because the size of the device as a whole will not change greatly even if the wafer size may become larger. However, in Al-deposition according to the CVD method of the prior art, no high speed deposition of 0.2 to 1 μm/min. cannot be realized, and therefore it could be employed with difficulty even if a deposited film of high quality was formed. However, by use of the deposition method according to the present invention, Al—Si of high quality can be deposited at high speed of 0.2 to 1 μm/min., and particularly the meaning fulfilled by the present invention in a sheet type CVD device corresponding to 6 inch or 8 inch demanded for high throughput is very important.

EXAMPLE 1

First, the procedure for Al film formation is as follows. By use of the device shown in FIG. 1, the reaction tube 2 is internally evacuated to ca. $1 \times 10^{-8}$ Torr by the evacuation unit 9. However, Al film can be also formed if the vacuum degree within the reaction tube 2 may be higher than $1 \times 10^{-8}$ Torr.

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line H$_2$ is employed. The second gas line is used for H$_2$.

By passing H$_2$ through the second gas line, the pressure within the reaction tube 2 is made a predetermined value by controlling the opening of the slow leak valve 8. A typical pressure in this Example is approximately 1.5 Torr. Then, the wafer is heated by current passage through the heater 4. After the wafer temperature has reached a predetermined temperature, DMAH is introduced into the reaction tube through the DMAH line. The total pressure is ca. 1.5 Torr, and the DMAH partial pressure is made ca. $1.5 \times 10^{-5}$ Torr. When DMAH is introduced into the reaction tube 2, Al is deposited.

The outline of the first deposition step is as described above.

In the first deposition step, after the formation of the continuous Al film of about 100 to 200 Å, high speed deposition is effected at the second deposition step. The condition for the second deposition step are made the total pressure of ca. 1.5 Torr and the DMAH partial pressure of ca. $1 \times 10^{-3}$ Torr. After a predetermined deposition time has elapsed, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric before taking out the wafer. The outline of Al film formation is as described above.

Actually, 130 Sheets of samples of Si wafer were prepared, the substrate temperatures were set at 13 levels, and Al films were deposited at the respective temperatures each for 10 sheets according to the procedure as described above under the following conditions:

during the first deposition step,
Total pressure: 1.5 Torr
DMAH partial pressure: $1.5 \times 10^{-5}$ Torr
during the second deposition step,
Total pressure: 1.5 Torr
DMAH partial pressure: $1.5 \times 10^{-3}$ Torr The Al films deposited by varying the substrate temperature at 13 levels were evaluated by use of various evaluation methods. The results are shown in Table 1.

Al was deposited on the Si wafer within the temperature range from 160° C. – 450° C.

When the substrate temperatures in the first and second deposition steps exceed 300° C., high speed deposition at 0.5 to 1.0 μm was possible, but the samples that surface reflectance becomes more or less worse as compared with the case of the temperature of 300° C. or lower were found. The reason may be considered to be due to the fact that, if the temperature in the first deposition step is high, the possibility that flatness of the extremely thin Al film deposited in the first deposition step is slightly inferior is enhanced.

EXAMPLE 2

Following the same procedure as in Example 1 to set the parameters as follows:

during the first deposition step,
Total pressure: 1.5 Torr
DMAH partial pressure: $1.0 \times 10^{-5}$ Torr
Substrate temperature: 270° C. or 300° C.
during the second deposition step,
Total pressure: 1.5 Torr
DMAH partial pressure: $1.0 \times 10^{-3}$ Torr and the substrate temperature of the second deposition step was varied at several levels which were higher than that of the first deposition step to deposit the Al film. And various evaluation results of the Al film deposited are shown in Table 2.

When the substrate temperature in the first deposition step is 270° C. or 300° C., there is no difference in the results obtained.

Similarly as in Example 1, when the substrate temperature in the second step exceeds 300° C., high speed deposition at 0.5 to 1.0 μm/min. was possible. The difference from Example 1 is that an Al film with high surface flatness having a reflectance of 80 to 95% could be formed even when the substrate temperature in the second step was 330° C., 350° C. by suppressing the substrate temperature in the first deposition step at 300° C. or lower.

EXAMPLE 3

This Example carries out Al deposition by use of Ar in place of $H_2$ as the carrier gas for DMAH in the same procedure as in Example 1. From the gas second line, $H_2$ is fed. As the result of evaluation of Al film obtained by this Example, Al was deposited on Si wafer at a temperature range of 160° C. to 450° C. similarly as in Table 1 in Example 1.

When the substrate temperatures in the first and second deposition steps exceed 300° C., high speed deposition at 0.5 to 1.0 μm was possible, but the probability that surface reflectance becomes more or less worse is slightly enhanced. The reason may be considered to be due to the fact that, if the temperature in the first deposition step is high, flatness of the extremely thin Al film deposited in the first deposition step is inferior.

EXAMPLE 4

This Example 4 performs Al deposition by use of Ar in place of $H_2$ as the carrier gas for DMAH in the same procedure as in Example 2. The second gas line fed $H_2$. When the substrate temperatures in the first deposition step were 270° C. and 300° C., there was no difference in the results obtained. The film quality obtained is substantially the same as in Table 2.

Similarly as in Example 1 or 2, when the substrate temperature in the second step exceeds 300° C., high speed deposition at 0.5 to 1.0 μm/min. was possible. The difference from Examples 1 and 3 is that an Al film with high surface flatness having a reflectance of 80 to 95% could be formed even when the substrate temperature in the second step was 330° C., 350° C. by suppressing the substrate temperature in the first deposition step at 300° C. or lower.

EXAMPLE 5

The Al film was formed on the substrate having the following constitution by using low pressure CVD device as shown in FIG. 3. That is, as the substrate, the following 17 kind thin films were used on the Si wafer.

(1) polycrystalline silicon (polycrystalline Si), (2) amorphous silicon (amorphous Si), (3) tungsten (W), (4) molybdenum (Mo), (5) tantalum (Ta), (6) tungsten silicide (WSi), (7) titanium silicide (TiSi), (8) aluminum (Al), (9) aluminum silicon (Al—Si), (10) titanium aluminum (Al—Ti), (11) titanium nitride (TiN), (12) copper (Cu), (13) aluminum silicon copper (Al—Si—Cu), (14) aluminum palladium (Al—Pd), (15) titanium (Ti), (16) molybdenum silicide (Mo—Si), (17) tantalum silicide (Ta—Si) were employed.

These samples were placed in the low pressure CVD device shown in FIG. 3 and Al films were formed within the same batch.

The deposition conditions at this time are as follows:
during the first deposition step,
 Total pressure: 0.3 Torr
 DMAH partial pressure: $3 \times 10^{-6}$ Torr
 Substrate temperature: 270° C.
during the second deposition step,
 Total pressure: 0.3 Torr
 DMAH partial pressure: $1 \times 10^{-4}$ Torr
 Substrate temperature: 330° C.

The film quality of the Al film formed under such conditions is not different from those at a substrate temperature in the second deposition of 330° C. in Table 2 as described above, and also the deposition rate in the second deposition step was very high as ca. 0.7 μm/min. for all of the substrates.

EXAMPLE 6

According to the same procedure as in Example 2, Al film was deposited by the use of $MMAH_2$ in place of DAMH as the starting gas. As the substrate, the same Si wafer as in Example 1 was used.

The deposition conditions at this time are as follows:
during the first deposition step,
 Reaction tube pressure: 1.5 Torr
 $MMAH_2$ partial pressure: $5 \times 10^{-5}$ Torr
 Substrate temperature: 270° C.
during the second deposition step,
 Reaction tube pressure: 1.5 Torr
 $MMAH_2$ partial pressure: $1 \times 10^{-3}$ Torr The film quality of deposited Al was not different from one at a substrate temperature in the second deposition step of 330° C. in Table 2.

Also, the deposition rate of Al in the second deposition step was ca. 0.7 μm/min. and not substantially different from the case of using DMAH.

EXAMPLE 7

First, the procedure for Al—Si film formation is as follows. By use of the device shown in FIG. 2, the reaction tube 2 is internally evacuated to ca. $1 \times 10^{-8}$ Torr by the evacuation unit 9. However, Al—Si film can be also formed if the vacuum degree within the reaction tube 2 may be higher than $1 \times 10^{-8}$ Torr.

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line, Ar is employed. The second gas line is used for $H_2$ and the third gas line for $Si_2H_6$.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH introduced into the reaction tube through the DMAH line. The total pressure is ca. 1.5 Torr, and the DMAH partial pressure is made ca. $1.5 \times 10^{-5}$ Torr. The $Si_2H_6$ partial pressure is made $2 \times 10^{-7}$ Torr. When $Si_2H_6$ and DMAH are introduced into the reaction tube 2, Al—Si is deposited.

The outline of the first deposition step is as described above.

In the first deposition step, after the formation of the continuous Al—Si film of about 100 to 200 Å, high speed deposition is effected at the second deposition step. The condition for the second deposition step are made the total pressure of ca. 1.5 Torr and the DMAH partial pressure of ca. $1 \times 10^{-3}$ Torr. After a predetermined deposition time has elapsed, feeding of DMAH and $Si_2H_6$ is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric before taking out the wafer. The outline of Al film formation is as described above.

Actually, 130 Sheets of samples of Si wafer were prepared, the substrate temperatures were set at 13 levels, and Al—Si films were deposited at the respective temperatures each for 10 sheets according to the procedure as described above under the following conditions:

during the first deposition step,
Total pressure: 1.5 Torr
DMAH partial pressure: $1.5 \times 10^{-5}$ Torr
$Si_2H_6$ partial pressure: $2.0 \times 10^{-7}$ Torr
during the second deposition step,
Total pressure: 1.5 Torr
DMAH partial pressure: $1.0 \times 10^{-3}$ Torr
$Si_2H_6$ partial pressure: $1.5 \times 10^{-5}$ Torr.

The Al—Si films deposited by varying the substrate temperature at 13 levels were evaluated by use of various evaluation methods. The results are the same as those in Table 1.

Al—Si was deposited on the Si wafer within the temperature range from 160° C. - 450° C.

When the substrate temperatures in the first and second deposition steps exceed 300° C., high speed deposition at 0.5 to 1.0 μm was possible, but the probability that surface reflectance becomes more or less worse is slightly enhanced. The reason may be considered to be due to the fact that, if the temperature in the first deposition step is high, flatness of the extremely thin Al—Si film deposited in the first deposition step is inferior.

EXAMPLE 8

Following the same procedure as in Example 7 to set the parameters as follows:
during the first deposition step,
Total pressure: 1.5 Torr
DMAH partial pressure: $1.0 \times 10^{-5}$ Torr
$Si_2H_6$ partial pressure: $1.5 \times 10^{-7}$ Torr
Substrate temperature: 270° C. or 300° C.
during the second deposition step,
Total pressure: 1.5 Torr
DMAH partial pressure: $1.0 \times 10^{-3}$ Torr
$Si_2H_6$ partial pressure: $1.5 \times 10^{-5}$ Torr
and the substrate temperature of the second deposition step was varied at 13 levels. As a result, various evaluation results of the Al—Si film are the same as those in Table 2.

When the substrate temperature in the first deposition step is 270° C. or 300° C., there is no difference in the results obtained.

Similarly as in Example 7, when the substrate temperature in the second step exceeds 300° C., high speed deposition at 0.5 to 1.0 μm/min. was possible. The difference from Example 7 is that an Al—Si film with high surface flatness having a reflectance of 80 to 95% could be formed even when the substrate temperatures in the second step was were 330° C., 350° C.

EXAMPLE 9

Following the same procedure as in Example 8 to set the parameters as follows:
during the first deposition step,
Total pressure: 1.5 Torr
DMAH partial pressure: $1.0 \times 10^{-5}$ Torr
Substrate temperature: 270° C.
during the second deposition step,
Total pressure: 1.5 Torr
DMAH partial pressure: $1.0 \times 10^{-3}$ Torr
Substrate temperature: 330° C.
and the $Si_2H_6$ partial pressure was varied from $3 \times 10^{-4}$ to 0.2 fold of DMAH partial pressure to effect deposition. The Si content (wt.%) of the Al—Si films were varied from 0.005% to 5% approximately in proportion to the $Si_2H_6$ partial pressure. As to resistivity, carbon content, average wiring life, deposition speed, hillock density and spike generation, the same results as in Example 1 were obtained. However, in samples having a Si content of 4% or higher, deposition was generated in the films which appeared to be Si to worsen slightly surface morphology, thereby making the reflectance 65% or lower. Samples having a Si content of less than 4% exhibited a reflectance of 80 to 95%, which was similarly good as in example 8.

EXAMPLE 10

This Example 10 carries our Al—Si deposition by use of Ar in place or $H_2$ as the carrier gas for DMAH in the same procedure as in Example 7. From the gas second line, $H_2$ as the reaction gas is fed. As the result of evaluation of Al—Si film obtained by this Example, Al—Si was deposited on Si wafer at a temperature range of 160° C. to 450° C. similarly as in Table 1 in Example 1.

When the substrate temperatures in the first and second deposition steps exceed 300° C., high speed deposition at 0.5 to 1.0 μm was possible, but the probability that surface reflectance becomes more or less worse is slightly enhanced. The reason may be considered to be due to the fact that, if the temperature in the first deposition step is high, flatness of the extremely thin Al—Si film deposited in the first deposition step is inferior.

EXAMPLE 11

This Example 11 performs Al—Si deposition by use of Ar in place of $H_2$ as the carrier gas for DMAH in the same procedure as in Example 8. The second gas line fed $H_2$. When the substrate temperatures in the first deposition step were 270° C. and 300° C., there was no difference in the results obtained. The film quality obtained is substantially the same as in Table 2.

Similarly as in Example 7 or 8, when the substrate temperature in the second step exceeds 300° C., high speed deposition at 0.5 to 1.0 μm/min. was possible. The difference from Examples 7 and 8 is that an Al—Si film with high surface flatness having a reflectance of 80 to 95% could be formed even when the substrate temperatures in the second step were 330° C., 350° C.

EXAMPLE 12

This Example 12 performs Al—Si deposition by use of Ar in place of $H_2$ as the carrier gas for DMAH in the same procedure as in Example 9. The second gas line fed $H_2$.

Deposition condition was shown below.
during the first deposition step,
Total pressure: 1.5 Torr
DMAH partial pressure: $1.0 \times 10^{-5}$ Torr
Substrate temperature: 270° C.
during the second deposition step,
Total pressure: 1.5 Torr
DMAH partial pressure: $1.0 \times 10^{-3}$ Torr
Substrate temperature: 330° C.
and the $Si_2H_6$ partial pressure was varied from $3 \times 10^{-4}$ to 0.2 fold of DMAH partial pressure to effect deposition. The Si content (wt. %) of the Al—Si films were varied from 0.005% to 5% approximately in proportion to the Si$_2$H$_6$ partial pressure. As to resistivity, carbon content, average wiring life, deposition speed, hillock density and spike generation, the same results as in Example 1 were obtained. However, in samples having a Si content of 4% or higher, deposition was generated in the films which appeared to be Si to worsen slightly surface morphology, thereby making the reflectance 65 % or lower. Samples having a Si content of less than 4% exhibited a reflectance of 80 to 95%, which was similarly good the same as in Example 8.

EXAMPLE 13

The Al film was formed on the substrate having the following constitution by using low pressure CVD device in FIG. 3. That is, as the substrate, (1) polycrystalline silicon (polycrystalline Si), (2) amorphous silicon (amorphous Si), (3) tungsten (W), (4) molybdenum (Mo), (5) tantalum (Ta), (6) tungsten silicide (WSi), (7) titanium silicide (TiSi), (8) aluminum (Al), (9) aluminum silicon (Al—Si), (10) titanium aluminum (Al—Ti), (11) titanium nitride (TiN), (12) copper (Cu), (13) aluminum silicon copper (Al—Si—Cu), (14) aluminum palladium (Al—Pd), (15) titanium (Ti), (16) molybdenum silicide (Mo—Si), (17) tantalum silicide (Ta—Si) were employed.

These samples were placed in the low pressure CVD device shown in FIG. 3 and Al—Si films were formed within the same batch.

The deposition conditions at this time are as follows:
during the first deposition step,
  Total pressure: 0.3 Torr
  DMAH partial pressure: $3 \times 10^{-6}$ Torr
  Si$_2$H$_6$ partial pressure: $1.0 \times 10^{-7}$ Torr
  Substrate temperature: 270° C.
during the second deposition step,
  Total pressure: 0.3 Torr
  DMAH partial pressure: $1 \times 10^{-4}$ Torr
  Si$_2$H$_6$ partial pressure: $3 \times 10^{-6}$ Torr
  Substrate temperature: 330° C.

The film quality of the Al—Si film formed under such conditions is not different from those at a substrate temperature in the second deposition of 330° C. in Table 2 as described above, and also the deposition rate in the second deposition step was very high as ca. 0.7 μm/min. for all of the substrates.

EXAMPLE 14

According to the same procedure as in Example 8, Al—Si film was deposited by the use of MMAH$_2$ in place of DAMH as the starting gas. As the substrate, Si wafer obtained by patterning the same SiO$_2$ thin film as shown in Example 7.

The deposition conditions at this time are as follows:
during the first deposition step,
  Reaction tube pressure: 1.5 Torr
  MMAH$_2$ partial pressure: $5 \times 10^{-5}$ Torr
  Si$_2$H$_6$ partial pressure: $1.0 \times 10^{-6}$ Torr
  Substrate temperature: 270° C.
during the second deposition step,
  Reaction tube pressure: 1.5 Torr
  MMAH$_2$ partial pressure: $1 \times 10^{-3}$ Torr
  Si$_2$H$_6$ partial pressure: $1 \times 10^{-5}$ Torr The film quality of deposited Al—Si was not different from one at a substrate temperature in the second deposition step of 330° C. in Table 2.

Also, the deposition rate of Al—Si in the second deposition step was ca. 0.7 μm/min. and not substantially different from the case of using DMAH.

EXAMPLE 15

According to the same procedure as in Example 8, Al—Si film was deposited by the use of SiH$_4$ in place of Si$_2$H$_6$. As the substrate, Si wafer was used.

The deposition conditions at this time are as follows:
during the first deposition step,
  Reaction tube pressure: 1.5 Torr
  DMAH partial pressure: $1.0 \times 10^{-5}$ Torr
  Si$_2$H$_6$ partial pressure: $5.0 \times 10^{-7}$ Torr
  Substrate temperature: 270° C.
during the second deposition step,
  Reaction tube pressure: 1.5 Torr
  DMAH partial pressure: $1 \times 10^{-3}$ Torr
  Si$_2$H$_6$ partial pressure: $5 \times 10^{-5}$ Torr
  Substrate temperature: 330° C.

The film quality of deposited Al—Si was not different from one at a substrate temperature in the second deposition step of 330° C. in Table 2.

Also, the deposition rate of Al—Si in the second deposition step was ca. 0.7 μm/min. and not substantially different from the case of using Si$_2$H$_6$.

EXAMPLE 16

Samples having Al films formed according to the same method as in Example 1 were prepared. When crystallinity of the Al film deposited on the Si wafer of the respective samples, namely under the same film forming conditions as in Example 1 by use of the X-ray diffraction method and the reflective electron beam diffraction method, it was found to be as described below.

Figure 5:
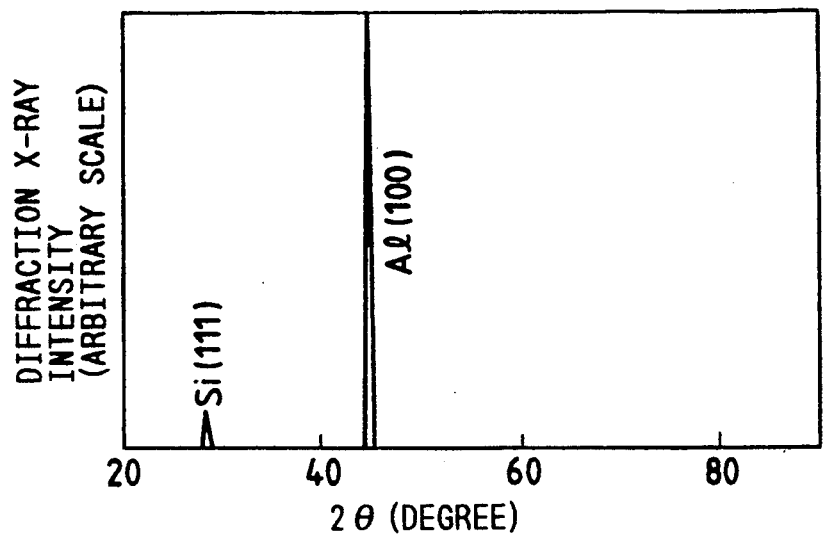
FIG. 5 is a chart showing the X-ray diffraction pattern on the Al deposited Si (111) substrate having Al deposited.
Figure 6A:
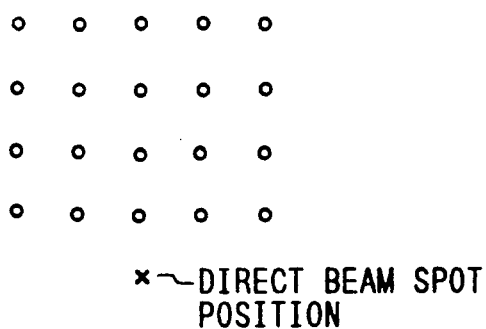
FIGS. 6A and 6B are charts showing the X-ray diffraction pattern.
Figure 6B:
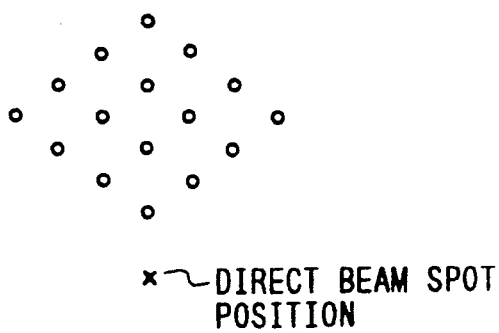

When the crystal direction of the Si substrate is (111) plane, from X-ray diffraction, as shown in FIG. 5, only the diffraction peak showing Al (100) was observed concerning Al. In reflective high speed electron beam diffraction by use of an acceleration voltage of 80 kV or 100 kV, as shown in FIG. 6, a monocrystal spot showing Al (100) was observed. FIG. 6A is a diffraction pattern when electron beam is permitted to enter Al (100) in the [001] direction, FIG. 6B a diffraction pattern when electron beam is permitted to enter Al (100) in the direction of [011]. Thus, the Al film on the Si (111) substrate was found to be a monocrystal having (100) plane. Within the first and second substrate temperature range in Table 1, those deposited at a range from 250° C. to 330° C. were found to have Al films reproducibly deposited which were monocrystalline.

Also, the Al films deposited on the Si (111) substrate with the substrate surface having off-angles differing by 1°, 2°, 3°, 4°, 5° from the Si (111) plane were also found to have Al (100) monocrystals deposited stably, particularly under the temperature conditions of the first and second substrate temperature ranging from 250° C. to 330° C., similarly as in the case when deposited on the Si (111) substrate as described above.

Figure 7:
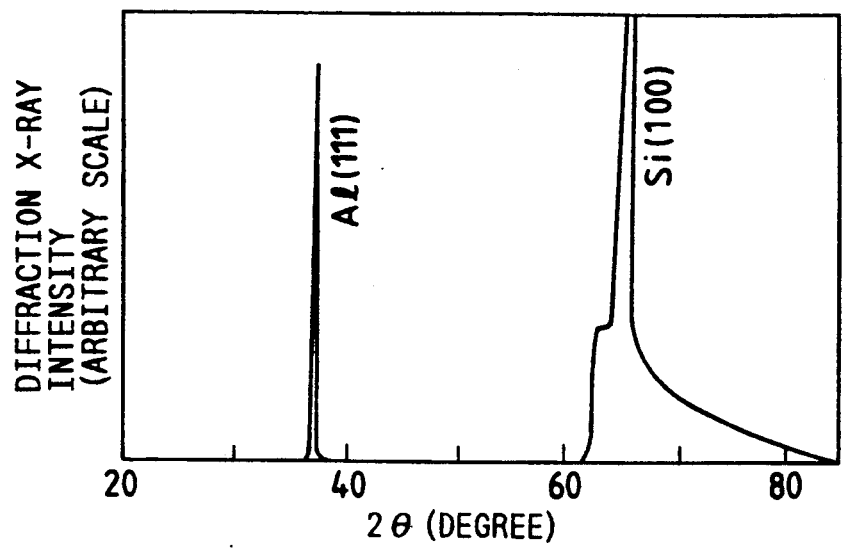
FIG. 7 is a chart showing the X-ray diffraction pattern on the Al deposited Si (100) substrate.

When the crystal direction of the Si substrate is (100) plane, from X-ray diffraction, as shown in FIG. 7, only the diffraction peak showing Al (111) was observed concerning Al. In reflective high speed electron beam diffraction by use of an acceleration voltage of 80 kV or 100 kV, a monocrystal spot showing Al (111) was observed. Thus, the Al film on the Si (100) substrate was found to be a monocrystal having (111) plane. Within the first and second substrate temperature range in Table 1, those deposited at a range from 250° C. to 330° C. were found to have Al films deposited which were stably monocrystalline.

Also, the Al films deposited on the Si (100) substrate with the substrate surface having off-angles differing by 1°, 2°, 3°, 4°, 5° from the Si (100) plane were also found to have Al (111) monocrystals deposited stably, particularly under the temperature conditions of the first and second substrate temperature ranging from 250° C. to 330° C., similarly as in the case when deposited on the Si (111) substrate as described above.

EXAMPLE 17

Samples having Al films formed according to the same method as in Example 2 were prepared. When crystallinity of the Al film deposited on the Si wafer by use of the X-ray diffraction method and the reflective electron beam diffraction method, it was found to be as described below.

When the crystal direction of the Si substrate is (111) plane, from X-ray diffraction, as shown in FIG. 5, only the diffraction peak showing Al (100) was observed concerning Al. In reflective high speed electron beam diffraction by use of an acceleration voltage of 80 kV or 100 kV, as shown in FIGS. 6A and 6B, a monocrystal spot showing Al (100) was observed. FIG. 6A is a diffraction pattern when electron beam is permitted to enter Al (100) in the [001] direction, FIG. 6B a diffraction pattern when electron beam is permitted to enter Al (100) in the direction of [011]. Thus, the Al film on the Si (111) substrate was found to be a monocrystal having (100) plane. Within the second substrate temperature range in Table 2, those deposited at a range from 250° C. to 330° C. were found to have Al films deposited which were monocrystalline.

Also, the Al films deposited on the Si (111) substrate with the substrate surface having off-angles differing by 1°, 2°, 3°, 4°, 5° from the Si (111) plane were also found to have Al (100) monocrystals deposited stably, particularly under the temperature conditions of the second substrate temperature ranging from 250° C. to 330° C., similarly as in the case when deposited on the Si (111) substrate as described above.

When the crystal direction of the Si substrate is (100) plane, from X-ray diffraction, as shown in FIG. 7, only the diffraction peak showing Al (111) was observed concerning Al. In reflective high speed electron beam diffraction by use of an acceleration voltage of 80 kV or 100 kV, a monocrystal spot showing Al (111) was observed. Thus, the Al film on the Si (100) substrate was found to be a monocrystal having (111) plane. Within the second substrate temperature range in Table 2, those deposited at a range from 250° C. to 330° C. were found to have Al films deposited which were stably monocrystalline.

Also, the Al films deposited on the Si (100) substrate with the substrate surface having off-angles differing by 1°, 2°, 3°, 4°, 5° from the Si (100) plane were also found to have Al (111) monocrystals deposited stably, particularly under the temperature conditions of the second substrate temperature ranging from 250° C. to 330° C., similarly as in the case when deposited on the Si (111) substrate as described above.

EXAMPLE 18

Crystallinity of the Al film formed by the method of Example 3 was examined. Similarly as in the case of Example 1, at a substrate temperature of the first and second substrate in Table 2 ranging from 250° C. to 330° C., Al(100) monocrystal was deposited on the Si (111) substrate, and Al (111) monocrystal on the Si (100) substrate.

EXAMPLE 19

Crystallinity of the Al film formed by the method of Example 4 was examined. Similarly as in the case of Example 1, at a substrate temperature of the first and second substrate in Table 2 ranging from 270° C. to 330° C., Al (100) monocrystal was deposited on the Si (111) substrate, and Al (111) monocrystal on the Si (100) substrate.

EXAMPLE 20

First, the procedure for Al film formation is as follows. By use of the device shown in FIG. 2, the reaction tube 2 is internally evacuated to ca. $1 \times 10^{-8}$ Torr by the evacuation unit 9. However, Al film can be also formed if the vacuum degree within the reaction tube 2 may be higher than $1 \times 10^{-8}$ Torr.

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line $H_2$ is used. The second gas line is used for $H_2$.

By passing $H_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The total pressure is ca. 1.5 Torr, and the DMAH partial pressure is made ca. $1.5 \times 10^{-4}$ Torr. When DMAH is introduced into the reaction tube 2, Al is deposited.

The outline of the first deposition step is as described above.

In the first deposition step, after the formation of the continuous Al film of about 100 to 200 Å, high speed deposition is effected at the second deposition step. The condition for the second deposition step are made the total pressure of ca. 1.5 Torr and the DMAH partial pressure of ca. $1 \times 10^{-3}$ Torr. After a predetermined deposition time has elapsed, feeding of DMAH is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric pressure before taking out the wafer. The outline of Al film formation is as described above.

Si substrates (N type, 1-2 ohm·cm) were subjected to thermal oxidation at a temperature of 1000° C. according to the hydrogen combustion system ($H_2$: 4 liters/M, $O_2$: 2 liters/M).

The film thickness was 7000 Å± +500 Å, and the refractive index 1.46. A photoresist was coated on the whole Si substrate, and a desired pattern was baked by an exposure machine. The pattern was such that various holes of 0.25 μm × 0.25 μm — 100 μm × 100 μm were opened. After development of the resist, with the photoresist as the mask, the subbing $SiO_2$ was etched by the reactive ion etching (RIE), etc. to have the substrate Si partially exposed. Thus, 130 sheets of samples having various sizes of $SiO_2$ holes of 0.25 μm × 0.25 μm — 100 μm × 100 μm were prepared, the substrate temperature was set at 13 levels, and for the samples each of 10 sheets at the respective temperatures, Al films were deposited following the procedure as described above under the following conditions:

during the first deposition step,
 Total pressure: 1.5 Torr
 DMAH partial pressure: $1.5 \times 10^{-5}$ Torr
during the second deposition step,
 Total pressure: 1.5 Torr
 DMAH partial pressure: $1.5 \times 10^{-3}$ Torr The Al films deposited by varying the substrate temperature at 13 levels were evaluated by use of various evaluation methods. The results are shown in Table 3.

In the above samples, no Al was deposited on $SiO_2$ at a temperature range from 160° C. to 450° C., and Al was deposited only on the portion with opening of $SiO_2$ to have Si exposed. Also, when 2 μm of Al deposition was carried out in the above temperature range continuously, similar selective depositability was maintained.

When the substrate temperatures in the first and second deposition steps exceed 300° C., high speed deposition at 0.5 to 1.0 μm was possible, but the probability that surface reflectance becomes more or less worse as compared with the case of 300° C. or lower is slightly enhanced. The reason may be considered to be due to the fact that, if the temperature in the first deposition step is high, flatness of the extremely thin Al film deposited in the first deposition step is inferior.

EXAMPLE 21

Following the same procedure as in Example 20 to set the parameters as follows:

during the first deposition step,
 Total pressure: 1.5 Torr
 DMAH partial pressure: $1.5 \times 10^{-5}$ Torr
 Substrate temperature: 270° C. or 300° C.
during the second deposition step,
 Total pressure: 1.5 Torr
 DMAH partial pressure: $1.0 \times 10^{-3}$ Torr and the substrate temperature of the second deposition step was varied at several levels which were higher than that of the first deposition step to deposit the Al film. And various evaluation results of the Al film deposited are shown in Table 4.

When the substrate temperature in the first deposition step is 270° C. or 300° C., there is no difference in the results obtained.

Similarly as in Example 20, when the substrate temperature in the second step exceeds 300° C., high speed deposition at 0.5 to 1.0 μm/min. was possible. The difference from Example 20 is that an Al film with high surface flatness having a reflectance of 80 to 95% could be formed even when the substrate temperature in the second step was 330° C., 350° C.

Similarly as in Example 20, Al was selectively deposited only on Si. Also, even when Al was deposited to 2 μm, the selective depositability was maintained.

EXAMPLE 22

This Example 22 carries out Al deposition by use of Ar in place of $H_2$ as the carrier gas for DMAH in the same procedure as in Example 20. From the gas second line, $H_2$ is fed.

Similarly as in Table 3 of Example 20, no Al was deposited on $SiO_2$ at a temperature range from 160° C. to 450° C., and Al was deposited only on the portion with opening of $SiO_2$ to have Si exposed. Also, when 2 μm of Al deposition was carried out in the above temperature range continuously, similar selective depositability was maintained.

When the substrate temperatures in the first and second deposition steps exceed 300° C., high speed deposition at 0.5 to 1.0 μm was possible, but the probability that surface reflectance becomes more or less worse is slightly enhanced. The reason may be considered to be due to the fact that, if the temperature in the first deposition step is high, flatness of the extremely thin Al film deposited in the first deposition step is inferior.

EXAMPLE 23

This Example 23 performed Al deposition by use of Ar in place of $H_2$ as the carrier gas for DMAH in the same procedure as in Example 21. The second gas line fed $H_2$. When the substrate temperatures in the first deposition step were 270° C. and 300° C., there was no difference in the results obtained. The film quality obtained is substantially the same as in Table 4.

Similarly as in Example 20 or 21, when the substrate temperature in the second step exceeds 300° C., high speed deposition at 0.5 to 1.0 μm/min. was possible. The difference from Examples 20 and 21 is that an Al film with high surface flatness having a reflectance of 80 to 95% could be reproducibly formed even when the substrate temperature in the second step was 330° C., 350° C.

Similarly as in Example 20 and Example 21, Al was selectively deposited only on Si. Also, even when Al was deposited to 2 μm, the selective depositability was maintained.

In the above samples, no Al was deposited on $SiO_2$ at a temperature range from 160° C. to 450° C., and Al was deposited only on the portion with opening of $SiO_2$ to have Si exposed. Also, when 2 μm of Al deposition was carried out in the above temperature range continuously, similar selective depositability was maintained.

EXAMPLE 24

By means of the low pressure CVD device shown in FIG. 3, Al films were formed on the substrates with the constitutions as described below (Samples 5-1 – 5-179).

PREPARATION OF SAMPLE 5-1

On a monocrystalline silicon as the electron donative first substrate surface material, a thermally oxidized $SiO_2$ film as the electron non-donative second substrate surface material was formed, and patterning was effected according to the photolithographic steps as shown in Example 20 to have the monocrystalline surface partially exposed.

The film thickness of the thermally oxidized $SiO_2$ film was found to be 7000 Å, with the size of the exposed portion of the monocrystalline silicon, namely opening being 3 μm × 3 μm. Thus, Sample 5-1 was prepared. (Hereinafter, such sample is expressed as "thermally oxidized $SiO_2$ (hereinafter abbreviated as T-$SiO_2$)-/monocrystalline silicon").

PREPARATION OF SAMPLES 5-2 – 5-179

Sample 5-2 is an oxidized film formed by normal pressure CVD (hereinafter abbreviated as SiO$_2$)/monocrystalline silicon.

Sample 5-3 is a boron doped oxidized film formed by normal pressure CVD (hereinafter abbreviated as BSG)/monocrystalline silicon.

Sample 5-4 is a phosphorus doped oxidized film formed by normal pressure CVD (hereinafter abbreviated as PSG)/monocrystalline silicon.

Sample 5-5 is a phosphorus and boron doped oxidized film formed by normal pressure CVD (hereinafter abbreviated as BSPG)/monocrystalline silicon.

Sample 5-6 is a nitrided film formed by plasma CVD (hereinafter abbreviated as P-S:N)/monocrystalline silicon.

Sample 5-7 is a thermally nitrided film (hereinafter abbreviated as T-S:N)/monocrsytalline silicon.

Sample 5-8 is a nitrided film formed by low pressure CVD (hereinafter abbreviated as LP-S:N)/monocrsytalline silicon.

Sample 5-9 is a nitrided film formed by ECR device (hereinafter abbreviated as ECR-SiN)/monocryustalline silicon.

Further, by combinations of the electron donative first substrate surface materials and the electron nondonative second substrate surface materials, Samples 5-11 – 5-179 shown in Table 5 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (TiN), copper (Cu), aluminum silicon copper (Al—Si—Cu), aluminum palladium (Al—Pd), titanium (Ti), molybdenum silicide (Mo—Si), tantalum silicide (Ta—Si) were employed. These samples were placed in the low pressure CVD device shown in FIG. 3, and Al films were formed within the same batch.

The deposition conditions were as follows:
during the first deposition step,
Total pressure: 0.3 Torr
DMAH partial pressure: $3 \times 10^{-6}$ Torr
Substrate temperature: 270° C.
during the second deposition step,
Total pressure: 0.3 Torr
DMAH partial pressure: $1 \times 10^{-4}$ Torr
Substrate temperature: 330° C.

As the result of film formation under such conditions, concerning all the samples applied with patterning from Sample 5-1 to 5-179, deposition of Al film occurred only on the electron donative first substrate surface film to embed completely the opening with the depth of 7000 Å.

The film quality of the Al film formed is not different from those at a substrate temperature in the second deposition of 330° C. in Table 2 as described above, and also the deposition rate in the second deposition step was very high as ca. 0.7 μm/min. for all of the substrates.

EXAMPLE 25

According to the same procedure as in Example 21, Al film was deposited by the use of MMAH$_2$ in place of DMAH. As the substrate, Si wafer obtained by patterning the same SiO$_2$ thin film as shown in Example 20.

The deposition conditions at this time are as follows:
during the first deposition step,
Reaction tube pressure: 1.5 Torr
MMAH$_2$ partial pressure: $5 \times 10^{-5}$ Torr
Substrate temperature: 270° C.
during the second deposition step,
Reaction tube pressure: 1.5 Torr
MMAH$_2$ partial pressure: $1 \times 10^{-3}$ Torr Similarly as in Example 21, Al film embedded completely the SiO$_2$ opening with the depth of 7000 Å and the film quality of deposited Al was not different from one at a substrate temperature in the second deposition step of 330° C. in Table 4.

Also, the deposition rate of Al in the second deposition step was ca. 0.7 μm/min. and not substantially different from the case of using DMAH.

In the above samples, no Al was deposited on SiO$_2$ at a temperature range from 160° C. to 450° C., and Al was deposited only on the portion with opening of SiO$_2$ to have Si exposed. Also, when 2 μm of Al deposition was carried out in the above temperature range continuously, similar selective depositability was maintained.

EXAMPLE 26

First, the procedure for Al—Si film formation is as follows. By use of the device shown in FIG. 1, the reaction tube 2 is internally evacuated to ca. $1 \times 10^{-8}$ Torr by the evacuation unit 9. However, Al—Si film can be also formed if the vacuum degree within the reaction tube 2 may be higher than $1 \times 10^{-8}$ Torr.

After washing of Si wafer, the conveying chamber 10 is released to atmospheric pressure and Si wafer is mounted in the conveying chamber. The conveying chamber is evacuated to ca. $1 \times 10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1 \times 10^{-8}$ Torr.

In this Example, DMAH is fed through the first gas line. As the carrier gas of DMAH line Ar is employed. The second gas line is used for H$_2$ and the third gas line for Si$_2$H$_6$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The total pressure is ca. 1.5 Torr, and the DMAH partial pressure is made ca. $1.5 \times 10^{-5}$ Torr. The Si$_2$H$_6$ partial pressure is made $2 \times 10^{-7}$ Torr. When DMAH and Si H are introduced into the reaction tube 2, Al—Si is deposited.

The outline of the first deposition step is as described above.

In the first deposition step, after the formation of the continuous Al—Si film of about 100 to 200 Å, high speed deposition is effected at the second deposition step. The condition for the second deposition step are made the total pressure of ca. 1.5 Torr, the DMAH partial pressure of ca. $1 \times 10^{-3}$ Torr and the Si$_2$H$_6$ partial pressure of ca. $1.5 \times 10^{-5}$ Torr. After a predetermined deposition time has elapsed, feeding of DMAH and Si$_2$H$_6$ is stopped. Next, heating of the heater 4 is stopped to cool the wafer., Feeding of H$_2$ gas is stopped, and after evacuation internally of the reaction tube, the wafer is transferred to the conveying chamber, and only the conveying chamber is made atmospheric pressure before taking out the wafer. The outline of Al film formation is as described above.

Si substrates (N type, 1-2 ohm·cm) were subjected to thermal oxidation at a temperature of 1000° C. according to the hydrogen combustion system ($H_2$: 4 liters/M, $O_2$: 2 liters/M).

The film thickness was 7000 Å ± 500 Å, and the refractive index 1.46. A photoresist was coated on the whole Si substrate, and a desired pattern was baked by an exposure machine. The pattern was such that various holes of 0.25 $\mu$m × 0.25 $\mu$m — 100 $\mu$m × 100 $\mu$m were opened. After development of the resist, with the photoresist as the mask, the subbing $SiO_2$ was etched by the reactive ion etching (RIE), etc. to have the substrate Si partially exposed. Thus, 130 sheets of samples having various sizes of $SiO_2$ holes of 0.25 $\mu$m × 0.25 $\mu$m — 100 $\mu$m × 100 $\mu$m were prepared, the substrate temperature was set at 13 levels, and for the samples each of 10 sheets at the respective temperatures, Al—Si films were selectively deposited following the procedure as described above under the following conditions:

during the first deposition step,
  Total pressure: 1.5 Torr
  DMAH partial pressure: $1.5 \times 10^{-5}$ Torr
  $Si_2H_6$ partial pressure: $2.0 \times 10^{-7}$ Torr
during the second deposition step,
  Total pressure: 1.5 Torr
  DMAH partial pressure: $1.0 \times 10^{-3}$ Torr
  $Si_2H_6$ partial pressure: $1.5 \times 10^{-5}$ Torr The Al—Si films deposited by varying the substrate temperature at 13 levels were evaluated by use of various evaluation methods. The results were the same as shown in Table 3.

In the above samples, no Al—Si was deposited on $SiO_2$ at a temperature range from 160° C. to 450° C., and Al—Si was deposited only on the portion with opening of $SiO_2$ to have Si exposed. Also, when 2 $\mu$m of Al—Si deposition was carried out in the above temperature range continuously, similar selective depositability was maintained.

When the substrate temperatures in the first and second deposition steps exceed 300° C., high speed deposition at 0.5 to 1.0 $\mu$m was possible, but the probability that surface reflectance becomes more or less worse is slightly enhanced. The reason may be considered to be due to the fact that, if the temperature in the first deposition step is high, flatness of the extremely thin Al—Si film deposited in the first deposition step is inferior.

EXAMPLE 27

Following the same procedure as in Example 26 to set the parameters as follows:
during the first deposition step,
  Total pressure: 1.5 Torr
  DMAH partial pressure: $1.0 \times 10^{-5}$ Torr
  $SiO_2H_6$ partial pressure: $1.5 \times 10^{-7}$ Torr
  Substrate temperature: 270° C. or 300° C.
during the second deposition step,
  Total pressure: 1.5 Torr
  DMAH partial pressure: $1.0 \times 10^{-3}$ Torr
  $Si_2H_6$ partial pressure: $1.5 \times 10^{-5}$ Torr
and the substrate temperature of the second deposition step was varied at 13 levels. And various evaluation results of the Al—Si film deposited were the same as in Table 4.

When the substrate temperature in the first deposition step is 270° C. or 300° C., there is no difference in the results obtained.

Similarly as in Example 20, when the substrate temperature in the second step exceeds 300° C., high speed deposition at 0.5 to 1.0 $\mu$m/min. was possible. The difference from Example 20 is that an Al—Si film with high surface flatness having a reflectance of 80 to 95% could be formed even when the substrate temperature in the second step was 330° C., 350° C.

Similarly as in Example 20, Al—Si was selectively deposited only on Si. Also, even when Al—Si was deposited to 2 $\mu$m, the selective depositability was maintained.

EXAMPLE 28

Following the same procedure as in Example 27 to set the parameters as follows:
during the first deposition step,
  Total pressure: 1.5 Torr
  DMAH partial pressure: $1.0 \times 10^{-5}$ Torr
  Substrate temperature: 270° C.
during the second deposition step,
  Total pressure: 1.5 Torr
  DMAH partial pressure: $1.0 \times 10^{-3}$ Torr
  Substrate temperature: 330° C.
and the $Si_2H_6$ partial pressure was varied from $3 \times 10^{-4}$ to 0.2 fold of DMAH partial pressure to effect deposition. The Si content (wt. %) of the Al—Si films were varied from 0.005% to 5% approximately in proportion to the $Si_2H_6$ partial pressure. As to resistivity, carbon content, average wiring life, deposition speed, hillock density and spike generation, the same results as in Example 1 were obtained. However, in samples having a Si content of 4% or higher, deposition was generated in the films which appeared to be Si to worsen slightly surface morphology, thereby making the reflectance 65% or lower. Samples having a Si content of less than 4% exhibited a reflectance of 80 to 95%, which was similarly good as in example 27.

Similarly as in Example 27, the selective depositability based on the substrate surface material was confirmed at the whole region.

EXAMPLE 29

This Example 29 performs Al—Si deposition by use of Ar in place of $H_2$ as the carrier gas for DMAH in the same procedure as in Example 26. The second gas line fed $H_2$.

Similarly the same results as in Table 3 in Example 20, no Al—Si was deposited on $SiO_2$ at a temperature range from 160° C. to 450° C., and Al—Si was deposited only on the portion with opening of $SiO_2$ to have Si exposed. Also, when 2 $\mu$m of Al—Si deposition was carried out in the above temperature range continuously, similar selective depositability was maintained.

When the substrate temperatures in the first and second deposition steps exceed 300° C., high speed deposition at 0.5 to 1.0 $\mu$m/min. was possible, but the probability that surface reflectance becomes more or less worse is slightly enhanced. The reason may be considered to be due to the fact that, if the temperature in the first deposition step is high, flatness of the extremely thin Al—Si film deposited in the first deposition step is inferior.

EXAMPLE 30

This Example 30 performs Al—Si deposition by use of Ar in place of $H_2$ as the carrier gas for DMAH in the same procedure as in Example 27. The second gas line fed $H_2$. When the substrate temperatures in the first deposition step were 270° C. and 300° C., there was no difference in the results obtained. The film quality obtained is substantially the same as in Table 4.

Similarly as in Example 7 or 27, when the substrate temperature in the second step exceeds 300° C., high speed deposition at 0.5 to 1.0 μm/min. was possible. The difference from Examples 26 and 27 is that an Al—Si film with high surface flatness having a reflectance of 80 to 95% could be formed even when the substrate temperatures in the second step were 330° C. and 350° C.

Similarly as in Examples 26 and 27, Al selectively deposited only on Si. Also, even when Al—Si was deposited to 2 μm, the selective depositability was maintained.

EXAMPLE 31

This Example 31 performs Al—Si deposition by use of Ar in place of $H_2$ as the carrier gas for DMAH in the same procedure as in Example 28. The second gas line fed $H_2$.

Deposition condition was shown below.
during the first deposition step,
 Total pressure: 1.5 Torr
 DMAH partial pressure: $1.0 \times 10^{-5}$ Torr
 Substrate temperature: 270° C.
during the second deposition step,
 Total pressure: 1.5 Torr
 DMAH partial pressure: $1.0 \times 10^{-3}$ Torr
 Substrate temperature: 330° C.
and the $Si_2H_6$ partial pressure was varied from $3 \times 10^{-4}$ to 0.2 fold of DMAH partial pressure to effect deposition. Similarly as in Example 28, the Si content (we. %) of the Al—Si films were varied from 0.005% to 5% approximately in proportion to the $Si_2H_6$ partial pressure. As to resistivity, carbon content, average wiring life, deposition speed, hillock density and spike generation, the same results as in Example 20 were obtained. However, in samples having a Si content of 4% or higher, deposition was generated in the films which appeared to be Si to worsen slightly surface morphology, thereby making the reflectance 65% or lower. Samples having a Si content of less than 4% exhibited a reflectance of 80 to 95%, which was similarly good the same as in Example 27.

Also, similarly as in Example 26, the selective depositability based on the substrate surface material was confirmed at the whole region.

EXAMPLE 32

By means of the low pressure CVD device shown in FIG. 3, Al—Si films were formed on the substrates with the constitutions as described below (Samples 5-1 - 5-179).

PREPARATION OF SAMPLE 5-1

On a monocrystalline silicon as the electron donative first substrate surface material, a thermally oxidized $SiO_2$ film as the electron non-donative second substrate surface material was formed, and patterning was effected according to the photolithographic steps as shown in Example 7 to have the monocrystalline surface partially exposed.

The film thickness of the thermally oxidized $SiO_2$ film was found to be 7000 Å, with the size of the exposed portion of the monocrystalline silicon, namely opening being 3 μm × 3 μm. Thus, Sample 5-1 was prepared. (Hereinafter, such sample is expressed as "thermally oxidized $SiO_2$ (hereinafter abbreviated as T-$SiO_2$)-/monocrystalline silicon").

PREPARATION OF SAMPLES 5-2 - 5-179

Sample 5-2 is an oxidized film formed by normal pressure CVD (hereinafter abbreviated as $SiO_2$)/monocrystalline silicon.

Sample 5-3 is a boron doped oxidized film formed by normal pressure CVD (hereinafter abbreviated as BSG)/monocrystalline silicon.

Sample 5-4 is a phosphorus doped oxidized film formed by normal pressure CVD (hereinafter abbreviated as PSG)/monocrystalline silicon.

Sample 5-5 is a phosphorus and boron doped oxidized film formed by normal pressure CVD (hereinafter abbreviated as BSPG)/monocrystalline silicon.

Sample 5-6 is a nitrided film formed by plasma CVD (hereinafter abbreviated as P-S:N)/monocrystalline silicon.

Sample 5-7 is a thermally nitrided film (hereinafter abbreviated as T-S:N)/monocrystalline silicon.

Sample 5-8 is a nitrided film formed by low pressure CVD (hereinafter abbreviated as LP-S:N)/monocrystalline silicon.

Sample 5-9 is a nitrided film formed by ECR device (hereinafter abbreviated as ECR-SiN)/monocrystalline silicon.

Further, by combinations of the electron donative first substrate surface materials and the electron non-donative second substrate surface materials, Samples 5-11 - 5-179 shown in Table 5 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al—Si), titanium aluminum (Al—Ti), titanium nitride (Ti—N), copper (Cu), aluminum silicon copper (Al—Si—Cu), aluminum palladium (Al—Pd), titanium (Ti), molybdenum silicide (Mo—Si), tantalum silicide (Ta—Si) were employed. These samples were placed in the low pressure CVD device shown in FIG. 3, and Al—Si films were formed within the same batch.

The deposition conditions were as follows:
during the first deposition step,
 Total pressure: 0.3 Torr
 DMAH partial pressure: $3 \times 10^{-6}$ Torr
 $Si_2H_6$ partial pressure: $1 \times 10^{-7}$ Torr
 Substrate temperature: 270° C.
during the second deposition step,
 Total pressure: 0.3 Torr
 DMAH partial pressure: $1 \times 10^{-4}$ Torr
 $Si_2H_6$ partial pressure: $3 \times 10^{-6}$ Torr
 Substrate temperature: 330° C.

As the result of film formation under such conditions, concerning all the samples applied with patterning from Sample 5-1 to 5-179, deposition of Al—Si film occurred only on the electron donative first substrate surface film to embed completely the opening with the depth of 7000 Å.

The film quality of the Al—Si film formed is not different from those at a substrate temperature in the second deposition of 330° C. in Table 2 as described above, and also the deposition rate in the second deposition step was very high as ca. 0.7 μm/min. for all of the substrates.

EXAMPLE 33

According to the same procedure as in Example 27, Al—Si film was deposited by the use of MMAH$_2$ in place of DMAH. As the substrate, Si wafer obtained by patterning the same SiO$_2$ thin film as shown in Example 26.

The deposition conditions at this time are as follows:
during the first deposition step,
  Reaction tube pressure: 1.5 Torr
  MMAH$_2$ partial pressure: $5 \times 10^{31\ 5}$ Torr
  Si$_2$H$_6$ partial pressure: $1 \times 10^{-6}$ Torr
  Substrate temperature: 270° C.
during the second deposition step,
  Reaction tube pressure: 1.5 Torr
  MMAH$_2$ partial pressure: $1 \times 10^{-3}$ Torr
  Si$_2$H$_6$ partial pressure: $1 \times 10^{-5}$ Torr Similarly as in Example 27, Al—Si film embedded completely the SiO$_2$ opening with the depth of 7000 Å and the film quality of deposited Al—Si was not different from one at a substrate temperature in the second deposition step of 330° C. in Table 2.

Also, the deposition rate of Al—Si in the second deposition step was ca. 0.7 μm/min. and not substantially different from the case of using DMAH.

EXAMPLE 34

According to the same procedure as in Example 27, Al—Si film was deposited by the use of SiH$_4$ in lace of Si$_2$H$_6$. As the substrate, Si wafer obtained by patterning the same SiO$_2$ thin film as shown in Example 1.

The deposition conditions at this time are as follows:
during the first deposition step,
  Reaction tube pressure: 1.5 Torr
  DMAH partial pressure: $1 \times 10^{-5}$ Torr
  Si$_2$H$_6$ partial pressure: $5 \times 10^{-7}$ Torr
  Substrate temperature: 270° C.
during the second deposition step,
  Reaction tube pressure: 1.5 Torr
  DMAH partial pressure: $1 \times 10^{-3}$ Torr
  Si$_2$H$_6$ partial pressure: $5 \times 10^{-5}$ Torr
  Substrate temperature: 330° C.

Similarly as in Example 27, Al—Si film embedded completely the SiO$_2$ opening with the depth of 7000 Å and the film quality of deposited Al—Si was not different from one at a substrate temperature in the second deposition step of 330° C. in Table 4.

Also, the deposition rate of Al—Si in the second deposition step was ca. 0.7 μm/min. and not substantially different from the case of using Si$_2$H$_6$.

EXAMPLE 25

According to the same method as in Example 20, a sample having an Al film formed thereon was prepared. The crystallinity of the Al film selectively deposited on Si at the same substrate temperature as in Table 1 was evaluated by the X-ray diffraction method and the scanning μ-RHEED microscope.

Figure 8:
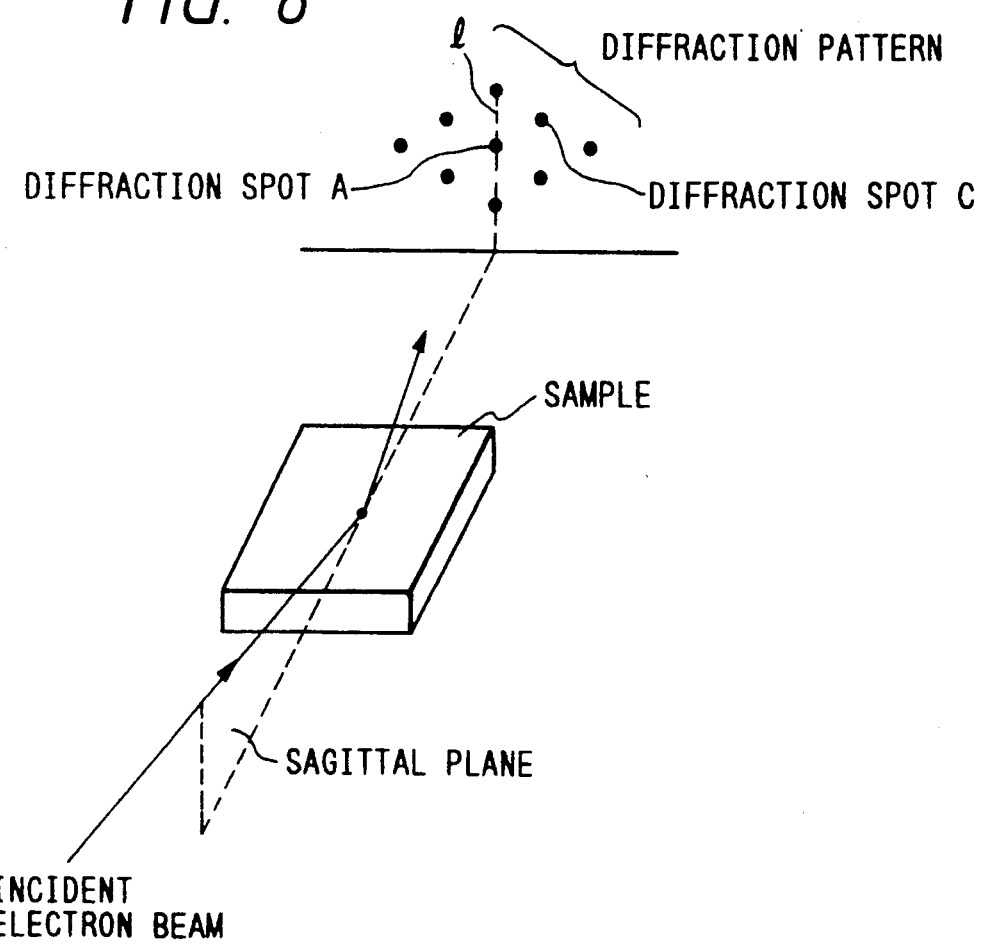
FIG. 8 is a schematic view for illustration of the scanning μ-RHEED.
Figure 9:
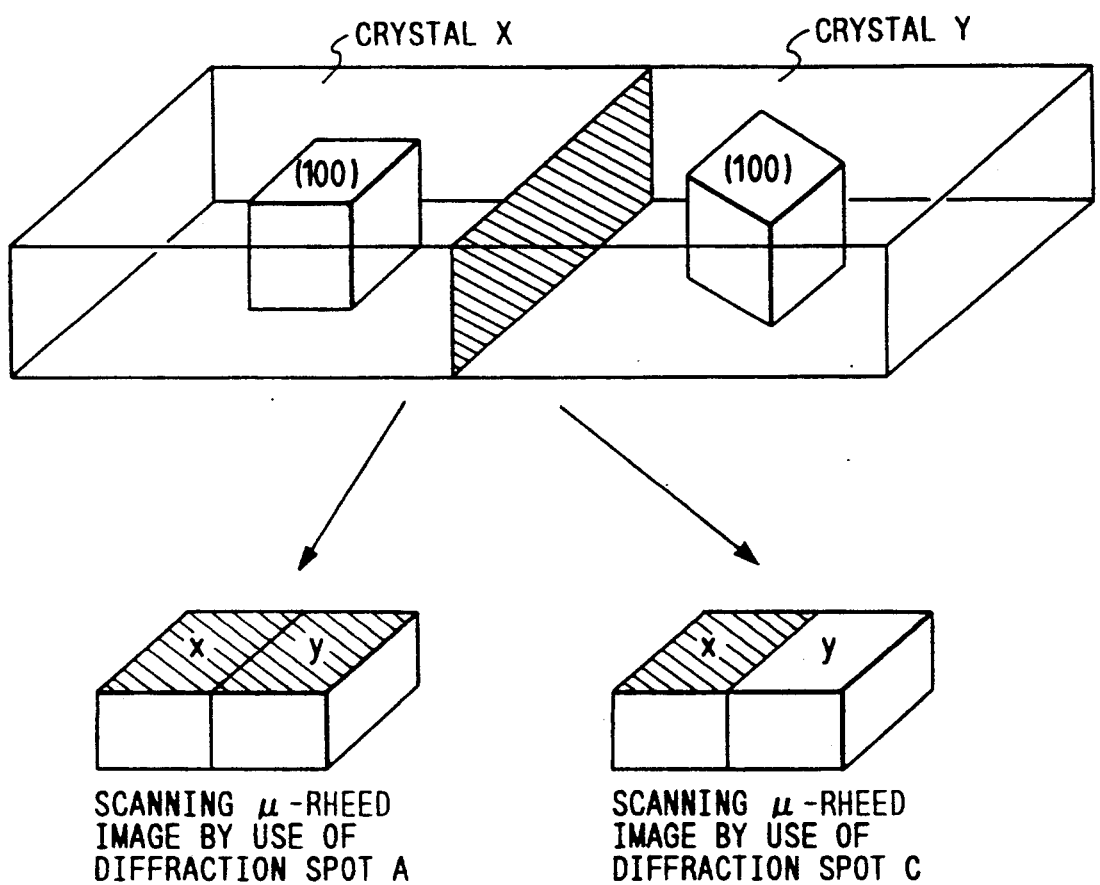
FIG. 9 is a schematic view for illustration of the principle of crystal grain observation with the scanning μ-RHEED image.

The scanning μ-RHEED microscope is the method disclosed in Extended Abstracts of the 21th Conference on Solid State Devices and Materials (1989) p.217 and Japanese Journal of Applied Physics vol. 28, No. 11 (1989), L2075. According to the RHEED (Reflection High Energy Electron Diffraction) method of prior art, electron beam was permitted to be incident on the sample surface at a shallow angle of 2°-3°, and the crystallinity of the sample surface was evaluated from the diffraction pattern formed by the diffracted electron beam. However, since the electron beam diameter is large as 100 μm to several hundred μm, only average information on the sample surface could be obtained. In the μ-RHEED microscope, an electron beam diffraction pattern from a specific fine region on the sample surface can be observed by narrowing the electron beam diameter of 0.1 μm. Also, by scanning the electron beam two-dimensionally on the sample surface, by use of any desired diffraction spot intensity change on the diffraction pattern as the image signal, two dimensional image (scanning μ-RHEED image) on the sample surface can be obtained. At this time by observation of the scanning μ-RHEED image by use of different diffraction spots A and C on the diffraction pattern as shown in FIG. 8, even if the lattice planes in parallel to the sample surface may be aligned in (100), the crystal grain boundaries rotating within the plane can be visualized as distinguished from each other. Here/ the diffraction spot A is a diffraction spot on the line (line 1) where the plane in which the diffraction pattern occurs and the sagittal plane formed by the incident electron beam are crossed at right angle, while the diffraction spot C is a diffraction spot not on the line 1. As shown in FIG. 9, when the lattice plane in parallel to the sample surface is, for example, (100), but crystal grains x and y are rotating mutually within the plane, in the scanning μ-RHEED image by use of the diffraction spot A, both crystal grains x and y are displayed as the region with strong intensity. On the other hand, in the scanning μ-RHEED image by use of the diffraction spot C, only the crystal grain x is displayed as the region with strong intensity. Therefore, by observation of the scanning P-RHEED image by use of the diffraction spots A and C as shown in FIG. 8, it can be discriminated whether the crystal in the region observed is a polycrystal including interplanar rotation or a monocrystal. In Extended Abstracts of the 21th Conference on Solid State Devices and Materials (1989) p.217 and Japanese Journal of Applied Physics vol. 28, No. 11 (1989) L2075, concerning Cu thin film, it has been clarified that, for example, even if the lattice plane in parallel to the sample surface may be {100}, there exists a crystal grain including interplanar rotation in the {100} crystal grains.

First, the Al film deposited selectively on the Si exposed surface at the substrate temperature in Table 1 was evaluated.

Figure 10:
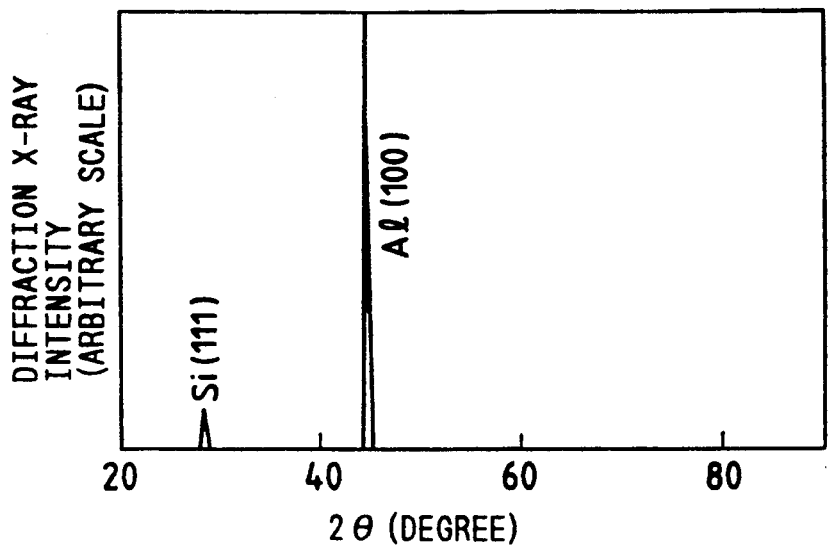
FIG. 10 is a chart showing the X-ray diffraction pattern on the Al deposited Si (111) substrate.
Figure 11A:
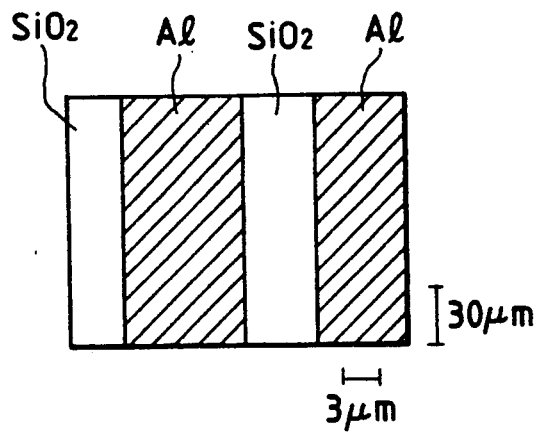
FIGS. 11A–11C are schematic views of the scanning secondary electron image and the scanning μ-RHEED image of the Al film selectively deposited on Si(111) substrate.
Figure 11B:
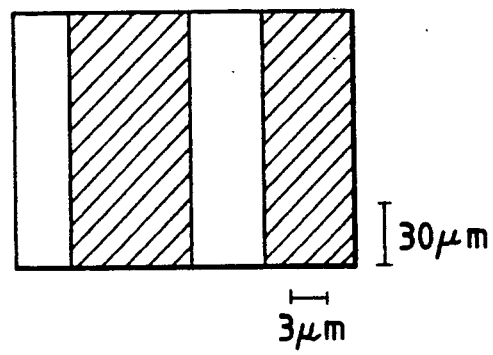
Figure 11C:
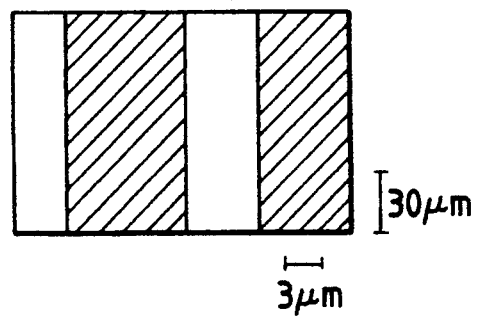

When the crystal direction on the Si substrate surface is (111) plane, from X-ray diffraction, concerning Al, as shown in FIG. 10, only the diffraction peak showing Al (100) could be observed. Next, crystallinity of the Al film deposited selectively was evaluated by use of a scanning μ-RHEED microscope. As shown in FIG. 11, after the region where Al had been selectively deposited was specified by the scanning secondary electron image showing the surface form (FIG. 11A), by use of the diffraction spot 200 (corresponding to the diffraction spot A in FIG. 8) and the diffraction spot 620 (corresponding to the diffraction spot C in FIG. 8) on the diffraction pattern occurring when the electron beam was permitted on the Al (100) plane from the [001] direction, the scanning μ-RHEED image (FIG. 11B and FIG. 11C) was observed. As shown schematically in FIG. 11B and FIG. 11C, there is no change in lightness and darkness on the Al film selectively deposited, and the Al selectively deposited was confirmed to be an Al (100) monocrystal.

On the other hand, when the Si exposed plane is not linear but like vie-hole, irrespectively of the via-hole diameter, the Al selectively deposited was found to be similarly Al (100) monocrystal. Those at substrate temperatures ranging from 250° C. to 330° C. were selectively deposited stably, and the Al obtained was found to become monocrystal.

Also, Al films deposited selectively on the Si (111) substrate with the Si (111) plane being at off-angles by 1°, 2°, 3°, 4°, 5° from the Si substrate were also found to deposit Al (100) monocrystals under the temperature conditions of the substrate temperature ranging from 250° C. to 330° C. similarly as deposited on the Si (111) substrate as described above.

Figure 12:
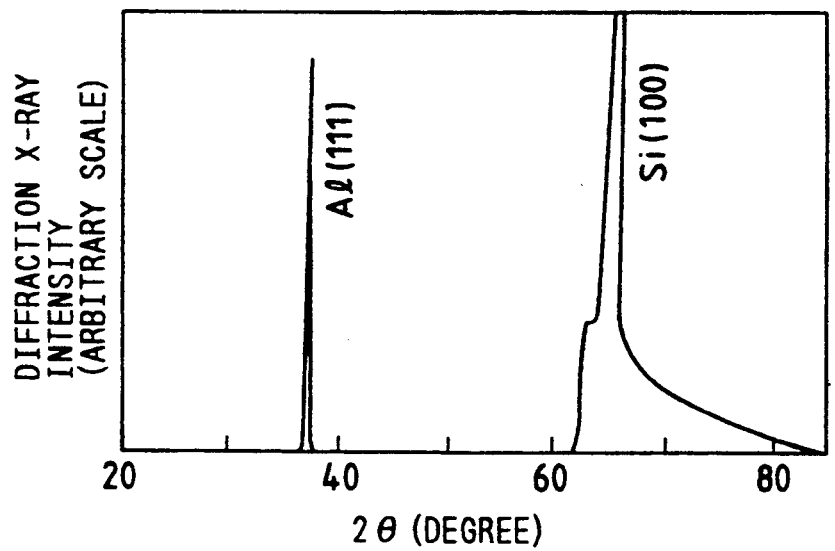
FIG. 12 is a chart showing the X-ray diffraction pattern on the Al deposited Si (100) substrate.
Figure 13A:
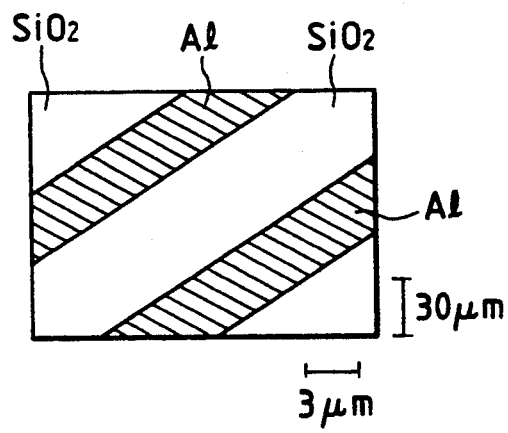
FIGS. 13A–13C are schematic views of the scanning secondary electron image and the scanning μ-RHEED image of the Al film selectively deposited on Si (100) substrate.
Figure 13B:
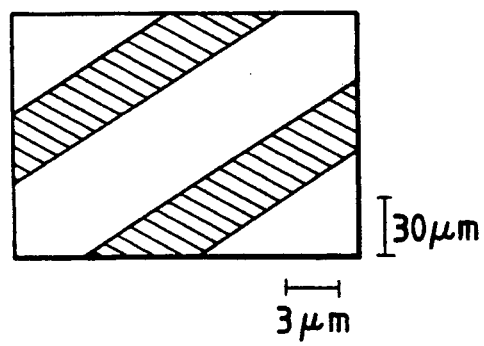
Figure 13C:
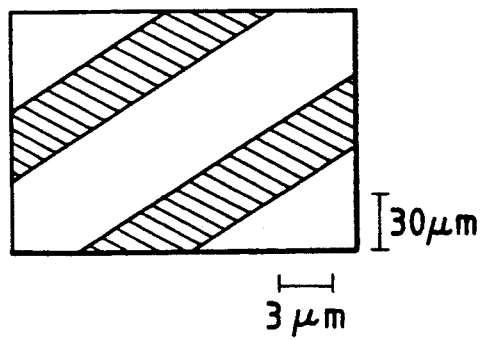

When the crystal direction of the Si substrate surface is the (100) plane, from X-ray diffraction, concerning Al, as shown in FIG. 12, only the diffraction peak showing Al (111) could be observed. FIG. 13 shows the scanning secondary electron image (FIG. 13A) and the scanning μ-RHEED image (FIGS. 13B and 13C) when Al was selectively deposited on only the Si exposed surface on a substrate having Si (100) exposed in a line by patterning of SiO2 in a line. For the scanning μ-RHEED image, the 333 diffraction spots (FIG. 13B) and 531 diffraction spots (FIG. 13C) were employed. The Al film selectively deposited was confirmed to be an Al (111) monocrystal. Those at substrate temperatures ranging from 250° C. to 330° C. were found to be selectively deposited stably, and the Al films obtained became monocrystals.

Also, Al films deposited selectively on the Si (100) substrate with the Si (100) plane being at off-angles by 1°, 2°, 3°, 4°, 5° from the Si substrate surface were also found to deposit Al (111) monocrystals under the temperature conditions of the substrate temperature ranging from 250° C. to 330° C. similarly as deposited on the Si (111) substrate as described above.

EXAMPLE 36

Samples having Al films formed according to the same method as in Example 21 were prepared. When crystallinity of the Al film selectively deposited on the Si exposed surface by use of the X-ray diffraction method and the scanning μ-RHEED microscope, it was found to be as described below.

When the crystal direction of the Si substrate is (111) plane, from X-ray diffraction, as shown in FIG. 10, only the diffraction peak showing Al (100) was observed. The Al film selectively deposited was evaluated by use of the scanning μ-RHEED microscope and it was found to be Al (100) monocrystal similarly the same as in Example 20.

Also, the Al films deposited on the Si (111) substrate with the substrate surface having off-angles differing by 1°, 2°, 3°, 4°, 5° from the Si (111) plane were also found to have Al (100) monocrystals deposited stably under the temperature conditions of the first and second substrate temperature ranging from 250° C. to 330° C. similarly as in the case when deposited on the Si (111) substrate as described above.

When the crystal direction of the Si substrate is (100) plane, from X-ray diffraction, as shown in FIG. 12, only the diffraction peak showing Al (111) was observed concerning Al. Also the Al film selectively deposited was evaluated by use of the scanning μ-RHEED microscope and it was found to be Al (100) monocrystal similarly the same as in Example 20. Within the second substrate temperature range in Table 4, those deposited at a range from 270° C. to 330° C. were found to have Al films deposited which were stably monocrystalline.

Also, the Al films deposited on the Si (100) substrate with the substrate surface having off-angles differing by 1°, 2°, 3°, 4°, 5° from the Si (100) plane were also found to have Al (111) monocrystals deposited under the temperature conditions of the second substrate temperature ranging from 270° C. to 330° C., similarly as in the case when deposited on the Si (111) substrate as described above.

EXAMPLE 37

Crystallinity of the Al film selectively deposited by the method of Example 22 was examined. Similarly as in the case of Example 20, at a substrate temperature of the first and second substrate in Table 2 ranging from 250° C. to 330° C., Al(100) monocrystal was deposited on the Si (111) substrate, and Al (111) monocrystal on the Si (100) substrate.

EXAMPLE 38

Crystallinity of the Al film selectively deposited by the method of Example 23 was examined. Similarly as in the case of Example 1, at a substrate temperature of the second substrate in Table 2 ranging from 270° C. to 330° C., Al (100) monocrystal was deposited on the Si (111) substrate, and Al (111) monocrystal on the Si (100) substrate.

EXAMPLE 39

Crystallinity of the Al film deposited selectively according to the same method as shown in Example 24 was evaluated.

From the scanning μ-RHEED microscope observation according to the same observation method as described in Example 35, when the first substrate material is Si (111), in either case when the second substrate material is T-SiO2, SiO2, BSG, PSG, BPSG, P-SiN, T-SIN, LP-SIN or ECR-SIN, the Al selectively deposited on Si was found to be Al (100). When the first substrate material is Si (100), in either case when the substrate material is T-SiO2, SiO2, BSG, PSG, BPSG, P-SIN, T-SIN, LP-SIN or ECR-SIN, the Al film selectively deposited was found to be Al (111).

When the first material is TiN, in either case when the second substrate material is T-SiO2, SiO2, BSG, PSG, BPSG, P-SIN, T-SIN, LP-SIN or ECR-SIN, the Al film selectively deposited was found to be oriented in Al (111) from X-ray diffraction, and from reflective high speed electron beam diffraction pattern of the prior art by use of an electron beam of an acceleration voltage of 80 kV or 100 kV, diffraction spots concerned with Al (111) were strongly observed.

EXAMPLE 40

As an example for forming source-drain electrodes of gate insulation type transistor, electrode formation within the contact hole on the source-drain was carried out by use of the film formation method according to the present invention. This is described by referring to FIG. 14.

Figure 14A:
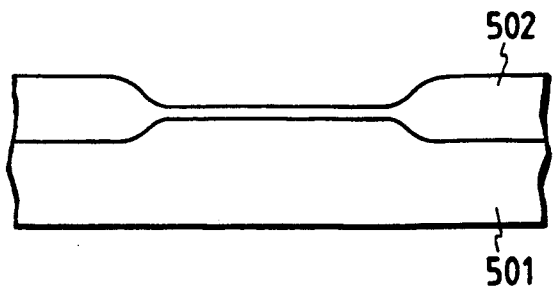
FIGS. 14A–14E are schematic views showing one embodiment of formation of a source drain electrode of gate insulation type transistor.

First, on a p-type silicon wafer 501, by use of conventional selective oxidation method, etc. a thick field oxidized film and a thin thermally oxidized film 502 were formed on the wafer 501 (FIG. 14A).

Figure 14B:
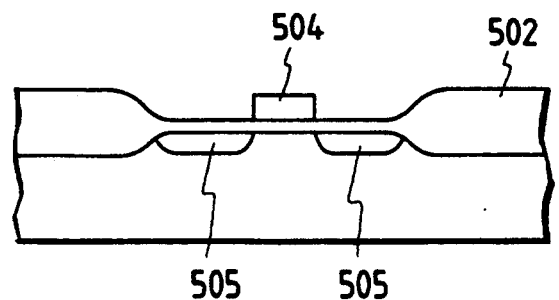

Next, with the use of SiH₄ gas as the starting gas, a polycrystalline silicon layer was formed by the thermal CVD method, a polycrystalline silicon gate electrode 504 was formed, and also with the thick field oxidized film and the gate electrode 504 as the mask, phosphorus was ion injected self-matchingly to form an impurity diffused region 505 of $1 \times 10^{18}$ cm$^{-3}$ (FIG. 14B).

Figure 14C:
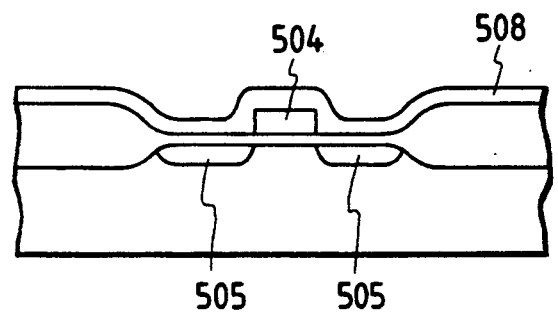

Next, an oxidized silicon film 508 was formed by use of the thermal CVD method (FIG. 14C).

Figure 14D:
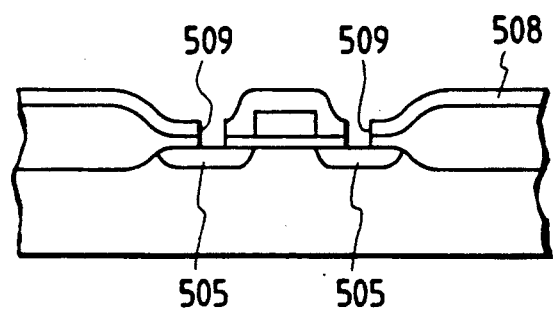

By use of the lithographic method, a contact hole 509 with a size of 0.5 μm × 0.5 μm was formed (FIG. 14D).

By transferring the substrate thus obtained to the device shown in FIG. 1, Al film was formed.

At this time, the substrate temperature was made 270° C., and DMAH was employed as the starting gas, H₂ as the carrier gas to carry out formation of Al film.

Figure 14E:
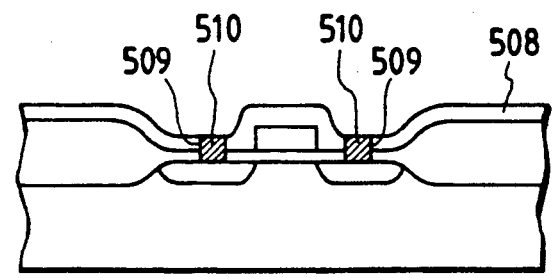

After completion of formation of Al film, the transistor was taken out from the film forming device and observed. As the result, it was found that Al film 510 was deposited only on the Si 505 wherein phosphorus was diffused in the contact hole 509, and not deposited on the oxidized film 508 (FIG. 14E). Further, the surface of the Al film 510 was very flat. When the characteristics of the transistor obtained were examined, extremely good characteristics were exhibited.

Separately, according to the same steps, the substrate was made N type and the impurity was changed from phosphorus to boron to prepare P channel MoS.

COMPARATIVE EXAMPLE

An Al film was formed on a monocrystalline silicon under the following conditions.

By passing Ar in place of H₂, Al was deposited by pyrolysis of DMAH. The total pressure at this time was made 1.5 Torr, the DMAH partial pressure $1.5 \times 10^{-4}$ Torr, and the substrate temperature of 270°–350° C.

When the Al film thus formed was evaluated, about 2% of carbon was found to be contained at the minimum.

Resistivity became greater by 2-fold or more than the case when hydrogen was employed.

As to reflectance, it was lowered to about ⅛ to 1/9 relative the case when hydrogen was employed.

Similarly, wiring life was shorter by 1 to 2 cipher, generation probability of hillock became greater by 2 cipher or more, and a large number of spikes were found to be generated.

As to the deposition speed, it was lowered to ½ to ¼.

As described above, Al deposited only by decomposition of DMAH without use of H₂ is inferior in film quality, and was unsatisfactory as the Al film for a semiconductor device.

Separately, without use of H₂, DMAH was decomposed by the optical CVD method to deposit Al. As the result, some improvement such as no containment of carbon, and the like was observed from as the Al film prepared as compared with the case when no light was employed, but other characteristics were not improved so much, and the Al film was still unsatisfactory as the Al film for a semiconductor device.

As described above, the mechanism of Al deposition according to the present invention may be presently hypothesized as follows.

Figure 15A:
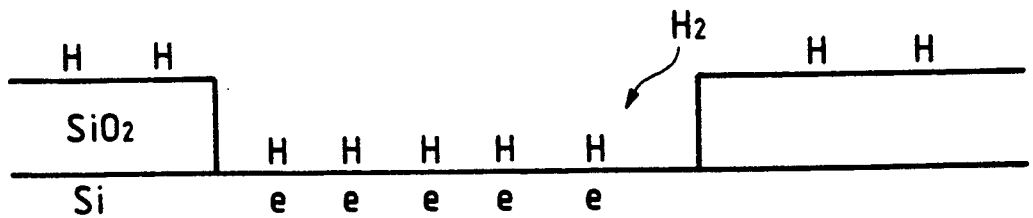
FIGS. 15A–15D are illustrations for explaining the reaction mechanism.
Figure 15B:
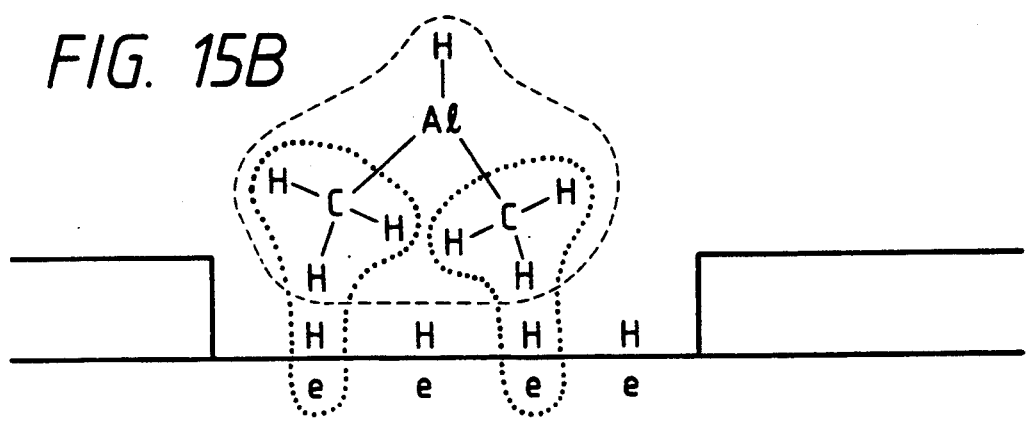
Figure 15C:
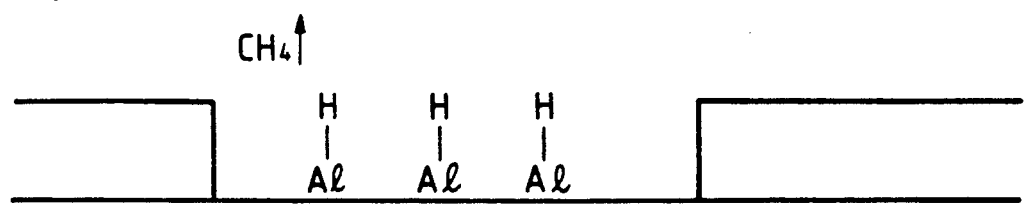

When DMAH reaches the electron donative substrate, namely the substrate having electrons under the state on which hydrogen atoms are attached (FIG. 15A) with the methyl groups directed toward the substrate side, one electron of the substrate cuts one bond of Al and a methyl group (FIGS. 15B and 15C).

The reaction scheme at this time is as follows:

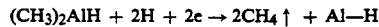

$$(CH_3)_2AlH + 2H + 2e \rightarrow 2CH_4 \uparrow + Al-H$$

Figure 15D:
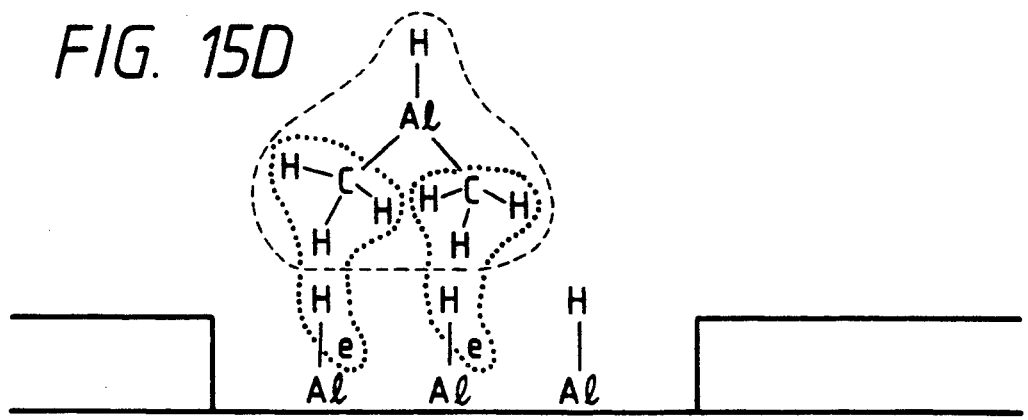

Further, similar reactions will proceed for the hydrogen atoms remaining on deposited Al having free electrons (FIG. 15D). Here, when hydrogen atoms are deficient, hydrogen molecules constituting the reaction gas are decomposed on the substrate to supply hydrogen atoms. On the other hand, since there is no electron on the electron non-donative surface, the above-mentioned reaction will not proceed and no Al deposited.

FIGS. 15A–15D are illustrations for better understanding of the reaction mechanism, and the numbers of H, e and Al shown in FIGS. 15A–15D are not necessarily coincident.

In the case of an Al—Si film, Si atoms are incorporated into Al during the process of the reaction as described above.

As described above, according to the present invention, a low resistivity, dense and flat Al or Al—Si film could be deposited on a substrate at high speed.

Also, excellent selective deposition could be effected.

TABLE 1

| Evaluation item | Substrate temperature during 1st and 2nd deposition | | | | | | | | | | | | |
|---|---|---|---|---|---|---|---|---|---|---|---|---|---|
| | 150° C. | 160° C. | 200° C. | 250° C. | 270° C. | 300° C. | 330° C. | 350° C. | 370° C. | 400° C. | 430° C. | 450° C. | 470° C. |
| Carbon content | Not deposited | ←──────────────────────────────────────────────→ | | | | | | | | | | | Several % contained |
| Resistivity | | ←─────────────────── Lower than detection limit ───────────────────→ | | | | | | | | | | | |
| | | | | | | 2.7~3.3 μΩcm | | | | | | | |
| Reflectance | | 80~95% | | | | | 70~80% | | | 70% | | | 60% ↓ |
| Average wiring life | ←────────────→ ←────────→ | | | | | | | ←──→ | | ←────→ | | | |
| | ←─────────────────────→ | | | | | | | | | ←──────────→ | | | |
| | | | | | | $1 \times 10^3 \sim 10^4$ hrs | | | | | $1 \times 10^2 \sim 10^3$ hrs | | |

TABLE 1-continued

| Evaluation item | Substrate temperature during 1st and 2nd deposition | | | | | | | | | | | |
|---|---|---|---|---|---|---|---|---|---|---|---|---|
| | 150° C. | 160° C. | 200° C. | 250° C. | 270° C. | 300° C. | 330° C. | 350° C. | 370° C. | 400° C. | 430° C. | 450° C. | 470° C. |
| Deposition speed | several Å/min ⟷ | 500~2000Å/min ⟷ | 0.2~0.5 μm/min ⟷ | | ⟵ | | | | 0.5~1.0 μm/min ⟶ | | | | 1.5 μm/min ⟷ |
| Hillock density | 0~10³/cm² ⟷ | | | 0~10/cm² ⟷ | | | | 0~10⁴/cm² ⟶ | | | | | |
| Spike generation | 0~10% ⟷ | | ~0% ⟵⟶ | | | | 0~30% ⟶ | | | | | | |

Average wiring life is time to wire breaking when current is passed at a current density of $1 \times 10^6$ A/cm² through a cross-sectional area of 1 μm² at 250° C.

Spike generation ratio is destruction probability at the junction portion of 0.15 μm depth.

TABLE 2

| Evaluation item | Substrate temperature during second deposition | | | | | | | |
|---|---|---|---|---|---|---|---|---|
| | 270° C.* | 300° C.* | 330° C. | 350° C. | 370° C. | 400° C. | 450° C. | 470° C. |
| Carbon content | ⟵ Lower than detection limit ⟶ | | | | | | | Several % contained |
| Resistivity | ⟵ 2.7~3.3 μΩcm ⟶ | | | | | | | |
| Reflectance | 80~95% ⟵⟶ | | | | | 70% ⟵⟶ | 60% ⟵⟶ | |
| Average wiring life | ⟵ 1 × 10³~10⁴ hrs ⟶ | | | | | | ⟵ 1 × 10²~10³ hrs ⟶ | |
| Deposition speed | 0.2~0.5 μm/min ⟵⟶ | | | 0.5~1.0 μm/min ⟵⟶ | | | 1000Å/min ⟵⟶ | |
| Hillock density | 0~10/cm² ⟵⟶ | | | | | | 0~10⁴/cm² ⟵⟶ | |
| Spike generation | ~0% ⟵⟶ | | 0~30% ⟶ | | | | | |

TABLE 3

| Evaluation item | Substrate temperature during 1st and 2nd deposition | | | | | | | | | | | | |
|---|---|---|---|---|---|---|---|---|---|---|---|---|---|
| | 150° C. | 160° C. | 200° C. | 250° C. | 270° C. | 300° C. | 330° C. | 350° C. | 370° C. | 400° C. | 430° C. | 450° C. | 470° C. |
| Carbon content | Not deposited | ⟵ Lower than detection limit ⟶ | | | | | | | | | | | Several % contained |
| Resistivity | | ⟵ 2.7~3.3 μΩcm ⟶ | | | | | | | | | | | |
| Reflectance | | 80~95% ⟵⟶ | | | 70~80% ⟵⟶ | | | | 70% ⟵⟶ | | 60% ⟵⟶ | | |
| Average wiring life | | ⟵ 1 × 10³~10⁴ hrs ⟶ | | | | | | | | | ⟵ 1 × 10²~10³ hrs ⟶ | | |
| Deposition speed | | Several Å/min ⟵⟶ | 500~2000 Å/min ⟵⟶ | 0.2~0.5 μm/min ⟵⟶ | | | | 0.5~1.0 μm/min ⟵⟶ | | | 1.5 μm/min ⟵⟶ | | |
| Hillock density | | 0~10³/cm² ⟵⟶ | | 0~10/cm² ⟵⟶ | | | | 0~10⁴/cm² ⟵⟶ | | | | | |

TABLE 3-continued

| | Substrate temperature during 1st and 2nd deposition | | | | | | | | | | | | |
|---|---|---|---|---|---|---|---|---|---|---|---|---|---|
| Evaluation item | 150° C. | 160° C. | 200° C. | 250° C. | 270° C. | 300° C. | 330° C. | 350° C. | 370° C. | 400° C. | 430° C. | 450° C. | 470° C. |
| Spike generation | 0~10% ←→ | | ←  | | | ~0% | | | →  | ← | 0~30% | | → |

TABLE 4

| | Substrate temperature during secoond deposition | | | | | | | | |
|---|---|---|---|---|---|---|---|---|---|
| Evaluation item | 270° C.* | 300° C.* | 330° C. | 350° C. | 370° C. | 400° C. | 430° C. | 450° C. | 470° C. |
| Carbon content | ← | | | | | | | → | Several % contained |
| | | Lower than detection limit | | | | | | | |
| Resistivity | ← | | | | | | | | → |
| | | | 2.7~3.3 μΩcm | | | | | | |
| | | 80~95% | | | | | 70% | | 60% ↓ |
| Reflectance | ← | | | | | → | ←→ | ← | → |
| Average wiring life | ← | | | | | → | ← | | → |
| | | 1 × 10³~10⁴ hrs | | | | | 1 × 10²~10³ hrs | | |
| | 0.2~0.5 μm/min | | | | 0.5~1.0 μm/min | | | | 1000Å/min |
| Deposition speed | ← | → | ← | | | | → | ← | → |
| | | | 0~10/cm² | | | | 0~10⁴/cm² | | |
| Hillock density | ← | | → | ← | | | | | → |
| | | ~0% | | | | | 0~30% | | |
| Spike generation | ← | | | → | ← | | | | → |

*In case where the first deposition was effected at substrate temperature of 270° C.

TABLE 5

| | Mono-crystalline Si | Poly-crystalline Si | Amorphous Si | W | Mo | Ta | WSi | TiSi | Al |
|---|---|---|---|---|---|---|---|---|---|
| T-SiO₂ | 5-1 | 5-11 | 5-21 | 5-31 | 5-41 | 5-51 | 5-61 | 5-71 | 5-81 |
| SiO₂ | 5-2 | 5-12 | 5-22 | 5-32 | 5-42 | 5-52 | 5-62 | 5-72 | 5-82 |
| BSG | 5-3 | 5-13 | 5-23 | 5-33 | 5-43 | 5-53 | 5-63 | 5-73 | 5-83 |
| PSG | 5-4 | 5-14 | 5-24 | 5-34 | 5-44 | 5-54 | 5-64 | 5-74 | 5-84 |
| BPSG | 5-5 | 5-15 | 5-25 | 5-35 | 5-45 | 5-55 | 5-65 | 5-75 | 5-85 |
| P-SiN | 5-6 | 5-16 | 5-26 | 5-36 | 5-46 | 5-56 | 5-66 | 5-76 | 5-86 |
| T-SiN | 5-7 | 5-17 | 5-27 | 5-37 | 5-47 | 5-57 | 5-67 | 5-77 | 5-87 |
| LP-SiN | 5-8 | 5-18 | 5-28 | 5-38 | 5-48 | 5-58 | 5-68 | 5-78 | 5-88 |
| ECR-SiN | 5-9 | 5-19 | 5-29 | 5-39 | 5-49 | 5-59 | 5-69 | 5-79 | 5-89 |

| | AlSi | AlTi | Ti—N | Cu | Al—Si—Cu | AlPd | Ti | Mo—Si | Ta—Si |
|---|---|---|---|---|---|---|---|---|---|
| T-SiO₂ | 5-91 | 5-101 | 5-111 | 5-121 | 5-131 | 5-141 | 5-151 | 5-161 | 5-171 |
| SiO₂ | 5-92 | 5-102 | 5-112 | 5-122 | 5-132 | 5-142 | 5-152 | 5-162 | 5-172 |
| BSG | 5-93 | 5-103 | 5-113 | 5-123 | 5-133 | 5-143 | 5-153 | 5-163 | 5-173 |
| PSG | 5-94 | 5-104 | 5-114 | 5-124 | 5-134 | 5-144 | 5-154 | 5-164 | 5-174 |
| BPSG | 5-95 | 5-105 | 5-115 | 5-125 | 5-135 | 5-145 | 5-155 | 5-165 | 5-175 |
| P-SiN | 5-96 | 5-106 | 5-116 | 5-126 | 5-136 | 5-146 | 5-156 | 5-166 | 5-176 |
| T-SiN | 5-97 | 5-107 | 5-117 | 5-127 | 5-137 | 5-147 | 5-157 | 5-167 | 5-177 |
| LP-SiN | 5-98 | 5-108 | 5-118 | 5-128 | 5-138 | 5-148 | 5-158 | 5-168 | 5-178 |
| ECR-SiN | 5-99 | 5-109 | 5-119 | 5-129 | 5-139 | 5-149 | 5-159 | 5-169 | 5-179 |

(Note) Numeral indicates Sample No.

What is claimed is:

1. A process for forming a deposited film comprising the steps of:
   (a) providing a substrate having an electron donative surface in a space for formation of the deposited film,
   (b) introducing a gas of an alkyl aluminum hydride into said space for formation of deposited film, and
   (c) maintaining the temperature of said electron donative surface within the range of from the decomposition temperature of said alkyl aluminum hydride to 450° C. to form a metal deposit composed mainly of aluminum on said electron donative surface while varying the deposition speed of aluminum from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

2. The process according to claim 1, wherein said alkyl aluminum hydride is dimethyl aluminum hydride.

3. The process according to claim 1, wherein said alkyl aluminum hydride is monomethyl aluminum hydride.

4. The process according to claim 1, wherein the deposition speed of aluminum is varied by setting the temperature of the electron donative surface low at the initial stage and then increasing the temperature to a high temperature.

5. The process according to claim 1, wherein the deposition speed of aluminum is varied by varying the partial pressure of the alkyl aluminum hydride.

6. A process for forming a deposited film comprising the steps of:
   (a) providing a substrate having an electron donative surface in a space for formation of the deposited film,
   (b) introducing a gas of an alkyl aluminum hydride and a gas containing silicon into said space for formation of deposited film, and
   (c) maintaining the temperature of said electron donative surface within the range of from the decomposition temperature of said alkyl aluminum hydride to 450° C. to form an aluminum-silicon film on said electron donative surface while varying the deposition speed of aluminum from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

7. The process according to claim 6, wherein said alkyl aluminum hydride is dimethyl aluminum hydride.

8. The process according to claim 6, wherein said alkyl aluminum hydride is monomethyl aluminum hydride.

9. The process according to claim 6, wherein the deposition speed of aluminum is varied by setting the temperature of the electron donative surface low at the initial stage and then increasing the temperature to a high temperature.

10. The process according to claim 6, wherein the deposition speed of aluminum is varied by varying the partial pressure of the alkyl aluminum hydride.

11. A process for forming a deposited film comprising the steps of:
    (a) providing a substrate having an electron donative surface (A) and an electron non-donative surface (B) in a space for formation of the deposited film,
    (b) introducing a gas of an alkyl aluminum hydride into said space for formation of the deposited film, and
    (c) maintaining the temperature of said electron donative surface (A) within the range of from the decomposition temperature of said alkyl aluminum hydride to 450° C. to form a metal deposit composed mainly of aluminum selectively on said electron donative surface (A) while varying the deposition speed of aluminum from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

12. The process according to claim 11, wherein said alkyl aluminum hydride is dimethyl aluminum hydride.

13. The process according to claim 11, wherein said alkyl aluminum hydride is monomethyl aluminum hydride.

14. The process according to claim 11, wherein the deposition speed of aluminum is varied by setting the temperature of the electron donative surface (A) low at the initial stage and then increasing the temperature to a high temperature.

15. The process according to claim 11, wherein the deposition speed of aluminum is varied by varying the partial pressure of the alkyl aluminum hydride.

16. A process for forming a deposited film comprising the steps of:
    (a) providing a substrate having an electron donative surface (A) and an electron non-donative surface (B) in a space for formation of the deposited film,
    (b) introducing a gas of an alkyl aluminum hydride and a gas containing silicon into said space for formation of the deposited film, and
    (c) maintaining the temperature of said electron donative surface (A) within the range of from the decomposition temperature of said alkyl aluminum hydride to 450° C. to form an aluminum-silicon film selectively on said electron donative surface (A) while varying the deposition speed of aluminum from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

17. The process according to claim 16, wherein said alkyl aluminum hydride is dimethyl aluminum hydride.

18. The process according to claim 16, wherein said alkyl aluminum hydride is monomethyl aluminum hydride.

19. The process according to claim 16, wherein the deposition speed of aluminum is varied by setting the temperature of the electron donative surface (A) low at the initial stage and then increasing the temperature to a high temperature.

20. The process according to claim 16, wherein the deposition speed of aluminum is varied by varying the partial pressure of the alkyl aluminum hydride.

21. A process for preparing a semiconductor device, which comprises:
    arranging in a space for formation of a deposited film a semiconductor substrate having an insulating film with an opening provided on a main surface thereof;
    introducing a gas of an alkyl aluminum hydride into said space;
    maintaining the temperature of said semiconductor substrate within the range from the decomposition temperature of said alkyl aluminum hydride to 450° C.; and depositing a metal composed mainly of aluminum selectively in said opening while varying the decomposition rate from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

22. A process for preparing a semiconductor device, which comprises:

arranging in a space for formation of a deposited film a semiconductor substrate having an insulating film with an opening provided on a main surface thereof;

introducing a gas of an alkyl aluminum hydride and a gas containing silicon into said space;

maintaining the temperature of said semiconductor substrate within the range from the decomposition temperature of said alkyl aluminum hydride to 450° C.; and depositing a metal composed mainly of aluminum and containing silicon selectively in said opening while varying the decomposition rate from a first deposition rate to a second deposition rate, wherein the first deposition rate is sufficiently lower than the second deposition rate to form an initial film having enhanced surface flatness with inhibited surface migration and wherein the second deposition rate is sufficiently higher than the first deposition rate to maximize layer formation and form a flat and high quality film at enhanced deposition speeds.

23. A process for forming a deposited film comprising the step of:

(a) providing a substrate having an electron donative surface in a space for formation of the deposited film, (b) introducing a gas of an alkyl aluminum hydride into said space for formation of deposited film, and (c) maintaining the temperature of said electron donative surface within the range of from the decomposition temperature of said alkyl aluminum hydride to 450° C. to form a metal deposited composed mainly of aluminum on said electron donative surface while varying the deposition speed of aluminum from a first deposition rate to a second deposition rate, wherein the second deposition rate is sufficiently higher than the first deposition rate to maximize layer formation and form a flat and high quality film at enhanced deposition speeds.

24. A process for forming a deposited film comprising the steps of:

(a) providing a substrate having an electron donative surface in a space for formation of the deposited film, (b) introducing a gas of an alkyl aluminum hydride and a gas containing silicon into said space for formation of deposited film, and (c) maintaining the temperature of said electron donative surface within the range of from the decomposition temperature of said alkyl aluminum hydride to 450° C. to form an aluminum-silicon film on said electron donative surface while varying the deposition speed of aluminum from a first deposition rate to a second deposition rate, wherein the second deposition rate is sufficiently higher than the first deposition rate to maximize layer formation and form a flat and high quality film at enhanced deposition speeds.

25. A process for forming a deposited film comprising the steps of:

(a) providing a substrate having an electron donative surface (A) and an electron non-donative surface (B) in a space for formation of the deposited film, (b) introducing a gas of an alkyl aluminum hydride into said space for formation of deposited film, and (c) maintaining the temperature of said electron donative surface (A) within the range of from the decomposition temperature of said alkyl aluminum hydride to 450° C. to form a metal deposited composed mainly of aluminum selectively on said electron donative surface (A) while varying the deposition speed of aluminum from a first deposition rate to a second deposition rate, wherein the second deposition rate is sufficiently higher than the first deposition rate to maximize layer formation and form a flat and high quality film at enhanced deposition speeds.

26. A process for forming a deposited film comprising the steps of:

(a) providing a substrate having an electron donative surface (A) and an electron non-donative surface (B) in a space for formation of the deposited film, (b) introducing a gas of an alkyl aluminum hydride and a gas containing silicon into said space for formation of deposited film, and (c) maintaining the temperature of said electron donative surface (A) within the range of from the decomposition temperature of said alkyl aluminum hydride to 450° C. to form an aluminum-silicon film selectively on said electron donative surface (A) while varying the deposition speed of aluminum from a first deposition rate to a second deposition rate, wherein the second deposition rate is sufficiently higher than the first deposition rate to maximize layer formation and form a flat and high quality film at enhanced deposition speeds.

27. A process for preparing a semiconductor device, which comprises:

arranging in a space for formation of a deposited film a semiconductor substrate having an insulating film with an opening provided on a main surface thereof;

introducing a gas of an alkyl aluminum hydride into said space;

maintaining the temperature of said semiconductor substrate within the range from the decomposition temperature of said alkyl aluminum hydride to 450° C.; and depositing a metal composed mainly of aluminum selectively in said opening while varying the decomposition rate from a first deposition rate to a second deposition rate, wherein the second deposition rate is sufficiently higher than the first deposition rate to maximize layer formation and form a flat and high quality film at enhanced deposition speeds.

28. A process for preparing a semiconductor device, which comprises:

arranging in a space for formation of a deposited film a semiconductor substrate having an insulating film with an opening provided on a main surface thereof;

introducing a gas of an alkyl aluminum hydride and a gas containing silicon into said space;

maintaining the temperature of said semiconductor substrate within the range from the decomposition temperature of said alkyl aluminum hydride to 450° C.; and depositing a metal composed mainly of aluminum and containing silicon selectively in said opening while varying the decomposition rate from a first deposition rate to a second deposition rate, wherein the second deposition rate is sufficiently higher than the first deposition rate to maximize layer formation and form a flat and high quality film at enhanced deposition speeds.

29. The process according to claims 1, 6, 11, 16, 21, 22, 23, 24, 25, 26, 27 or 28, wherein the temperature is maintained within the range of from 200° C. to 450° C.

30. The process according to claim 29, wherein the temperature is maintained within the range of from 200° C. to 400° C.

31. The process according to claim 23, wherein the substrate further comprises an electron non-donative surface, said deposited metal being selectively deposited on the electron donative surface.

32. The process according to claim 23 further comprising the step of introducing hydrogen gas into the space for formation of the deposited film.

33. The process according to claim 23, 31 or 32, wherein the electron donative surface is comprised of a semiconductor or a conductor.

34. The process according to claim 31, wherein the electron non-donative surface comprises an insulator.

35. The process according to claim 23 or 31, wherein the decomposition temperature is 160° C.

36. The process according to claim 23 or 31, wherein at lest one of the pressure and the temperature of the alkyl aluminum hydride gas being introduced during the time of the second deposition rate is higher than it is during the time of the first deposition rate.

37. The process for forming a deposited film comprising the steps of:
   (a) providing a substrate having an electron donative surface in a space for formation of the deposited film,
   (b) introducing a gas of an alkyl aluminum hydride into said space for formation of deposited film, and
   (c) maintaining the temperature of said electron donative surface within the range of from the decomposition temperature of said alkyl aluminum hydride to 450° C. to form a metal deposit composed mainly of aluminum on said electron donative surface while varying the deposition speed of aluminum from a first deposition rate of less than 800 Å/min. to a second deposition rate of more than 0.1 μm/min.

38. The process according to claim 37, wherein the substrate further comprises an electron non-donative surface, said metal deposit being selectively deposited on the electron donative surface.

39. The process according to claim 37 further comprising the step of introducing hydrogen gas into the space for formation of the deposited film.

40. The process according to claim 37, 38 or 39, wherein the electron donative surface is comprised of a semiconductor or a conductor.

41. The process according to claim 38, wherein the electron non-donative surface comprises an insulator.

42. The process according to claim 37 or 38, wherein the decomposition temperature is 160° C.

43. The process according to claim 37 or 38, wherein at least one of the pressure and the temperature of the alkyl aluminum hydride gas being introduced during the time of the second deposition rate is higher than it is during the time of the first deposition rate.

* * * * *

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

ON TITLE PAGE

In [56] References Cited, under FOREIGN PATENT DOCUMENTS:
"1252776  10/1989  Japan" should read
--1-252776  10/1989  Japan--;
"2012913  1/1990  Japan" should read
--2-12913  7/1990  Japan--;
"2170419  7/1990  Japan" should read
--2-170419  7/1990  Japan; and
"2185026  7/1990  Japan" should read
--2-185026  7/1990  Japan--.

COLUMN 1

Line 38, "The thickness" should read --The film thickness--.
Line 58, "viahole" should read --via-hole--.
Line 59, "1 Mm" should read --1 µm--.
Line 65, "viahole" should read --via-hole--.

COLUMN 2

Line 9, "particles" should read --particle--.
Line 14, "to-solve" should read --to solve--.
Line 66, "using no" should read --not using--.

COLUMN 3

Line 21, "is" should be deleted.
Line 35, "TBA" should read --TIBA--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMN 4

Line 1, "have" should read --has--.
Line 4, "is," should read --is--.

COLUMN 5

Line 41, "shifting" should read --varying--.

COLUMN 7

Line 48, "Mm" should read --μm--.
Line 67, "for sufficient improvement" should be deleted.

COLUMN 8

Line 10, "as" should read --by--.

COLUMN 9

Line 68, "shown" should read --shown in--.

COLUMN 10

Line 22, "of" should be deleted.

COLUMN 12

Line 23, "$1 \times 10^{-5}$ fold" should read --$1 \times 10^{-5}$-fold--.
Line 25, "$1 \times 10^{-7}$ fold" should read --$1 \times 10^{-5}$-fold--.

UNITED STATES PATENT AND TRADEMARK OFFICE
CERTIFICATE OF CORRECTION

PATENT NO. : 5,316,972

DATED : May 31, 1994

INVENTOR(S) : NOBUO MIKOSHIBA, ET AL.

It is certified that error appears in the above-identified patent and that said Letters Patent is hereby corrected as shown below:

COLUMN 13

Line 12, "which" should read --which is--.
    Line 31, "are" should read --is--.
    Line 34, "reasons" should read --reason--.
    Line 55, "knowledges" should read --discovery--.

COLUMN 15

Line 2, "$Si_2H_6$partial" should read --$Si_2H_6$ partial--.
    Line 47, "are" should read --is--.
    Line 52, "µm/min-cannot" should read --µm/min. can--.
    Line 61, "throughput" should read --through-put--.

COLUMN 16

Line 59, "which" should read --which is--.

COLUMN 17

Line 9, "are" should read --is--.
    Line 12, "reasons" should read --reason--.
    Line 33, "knowledges" should read --discovery--.
    Line 64, "ple,," should read --ple,--.

COLUMN 18

Line 13, "Continuous," should read --continuous,--.

COLUMN 19

Line 10, "through put" should read --through-put--.
    Line 22, "are" should read --is--.

UNITED STATES PATENT AND TRADEMARK OFFICE
CERTIFICATE OF CORRECTION

PATENT NO. : 5,316,972

DATED : May 31, 1994

INVENTOR(S) : NOBUO MIKOSHIBA, ET AL.

It is certified that error appears in the above-identified patent and that said Letters Patent is hereby corrected as shown below:

COLUMN 19

Line 27, "cannot" should read --can--.
   Line 35, "throughput" should read --through-put--.

COLUMN 20

Line 4, "condition" should read --conditions--.
   Line 9, "H2gas" should read --$H_2$ gas--.

COLUMN 21

Line 42, "kind" should read --kinds of--.

COLUMN 22

Line 7, "DAMH" should read --DMAH--.
   Line 51, "introduced" should read --is introduced--.
   Line 62, "condition" should read --conditions--.
   Line 66, "$Si_2 H_6$is" should read --$Si_2H_6$ is--.

COLUMN 23

Line 58, "was" should be deleted.

COLUMN 24

Line 5, "were" should read --was--.
   Line 67, "were" should read --was--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMN 25

Line 50, "DAMH" should read --DMAH--.
Line 51, "obtained" should read --was obtained--.
Line 62, $Si_2H_6$partial" should read --$Si_2H_6$ partial--.

COLUMN 28

Line 49, "condition" should read --conditions" and "made" should read --making--.
Line 64, "7000 Å± +500 Å," should read --7000 Å ± 500 Å,--.

COLUMN 31

Line 19, "monocrsytalline" should read --monocrystalline--.
Line 21, "monocrsy-" should read --monocrys- --.
Line 24, "monocryustal-" should read --monocrystal- --.
Line 67, "obtained" should read --was obtained--.

COLUMN 32

Line 55, "Si H" should read --$Si_2H_6$--.
Line 62, "condition" should read --conditions--.

COLUMN 33

Line 58, "$SiO_2H_6$" should read --$Si_2H_6$--.

COLUMN 34

Line 30, "were" should read --was--.
Line 49, "$H_2$as" should read --$H_2$ as--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMN 35

Line 28, "condition was" should read --conditions are--.
    Line 39, "(we. %)" should read --(wt. %)--.
    Line 40, "were" should read --was--.

COLUMN 37

Line 11, "obtained" should read --was obtained--.
    Line 17, "$5 \times 10^{31\ 5}$ Torr" should read --$5 \times 10^{-5}$ Torr--.
    Line 18, "$Si_2 H_6$partial" should read --$Si_2H_6$ partial--.
    Line 35, "lace" should read --place--.
    Line 36, "obtained" should read --was obtained--.
    Line 58, "EXAMPLE 25" should read --EXAMPLE 35--.
    Line 66, "21th" should read --21st--.

COLUMN 38

Line 24, "Here/" should read --Here,--.
    Line 39, "P-RHEED" should read --µ-RHEED--.
    Line 43, "21th" should read --21st--.

COLUMN 39

Line 7, "vie-hole," should read --via-hole,--.

COLUMN 40

Line 44, "T-SIN, LP-SIN or ECR-SIN," should read
            --T-SiN, LP-SiN or ECR-SiN,--.
    Line 48, "P-SIN, T-SIN, LP-SIN or ECR-SIN," should read
            --P-SiN, T-SiN, LP-SiN or ECR-SiN,--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMN 40

Line 52, "P-SIN, T-SIN, LP-SIN or ECR-SIN," should read --P-SiN, T-SiN, LP-SiN or ECR-SiN,--.

COLUMN 41

Line 45, "relative" should read --relative to--.
   Line 46, "I" should read --1--.

COLUMN 42

Line 11, "as" should be deleted.
   Line 35, "deposited." should read --will be deposited.--.

COLUMN 43

TABLE 1-continued, "500~2000Å Å/min" should read --500~2000 Å/min--.

After TABLE 1-continued, insert: --Note: No deposition occurs at substrate temperature of 150°C.--.

COLUMN 44

TABLE 2, "400°C.    450°C." should read --400°C.   430°C.   450°C.--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMNS 43-44

TABLE 2, " Spike generation  ~0%   0~30% "

should read

-- Spike generation  ~0%   0~30% --.

COLUMN 49

Line 5, "composition" should read --position--.
Line 28, "decomposition" should read --deposition--.
Line 47, "deposited" should read --deposit--.

COLUMN 50

Line 12, "of" should read --of the--.
Line 16, "deposited" should read --deposit--.
Line 32, "of" should read --of the--.
Line 54, "from" should read --of from--.
Line 59, "composition" should read --position--.

COLUMN 51

Line 6, "from" should read --of from--.
Line 11, "decomposition" should read --deposition--.
Line 38, "lest" should read --least--.

UNITED STATES PATENT AND TRADEMARK OFFICE
CERTIFICATE OF CORRECTION

PATENT NO. : 5,316,972
DATED : May 31, 1994
INVENTOR(S) : NOBUO MIKOSHIBA, ET AL.

It is certified that error appears in the above-identified patent and that said Letters Patent is hereby corrected as shown below:

COLUMN 52

Line 3, "The" should read --A--.

Signed and Sealed this

Twenty-ninth Day of November, 1994

Attest:

BRUCE LEHMAN

Attesting Officer     Commissioner of Patents and Trademarks